(12) United States Patent
Whittaker et al.

(10) Patent No.: US 12,519,471 B2
(45) Date of Patent: Jan. 6, 2026

(54) SYSTEMS AND METHODS FOR QUBIT CONTROL

(71) Applicant: D-WAVE SYSTEMS INC., Burnaby (CA)

(72) Inventors: Jed D. Whittaker, Vancouver (CA); Mark H. Volkmann, Burnaby (CA); Andrew J. Berkley, Montreal (CA); Reza Molavi, North Vancouver (CA); Paul Bunyk, Pt. Roberts, WA (US); Loren J. Swenson, San Jose, CA (US)

(73) Assignee: 1372934 B.C. Ltd., Burnaby (CA)

( * ) Notice: Subject to any disclaimer, the term of this patent is extended or adjusted under 35 U.S.C. 154(b) by 24 days.

(21) Appl. No.: 18/718,139

(22) PCT Filed: Dec. 14, 2022

(86) PCT No.: PCT/US2022/081507
§ 371 (c)(1),
(2) Date: Jun. 10, 2024

(87) PCT Pub. No.: WO2023/114811
PCT Pub. Date: Jun. 22, 2023

(65) Prior Publication Data
US 2025/0055457 A1    Feb. 13, 2025

Related U.S. Application Data

(60) Provisional application No. 63/265,605, filed on Dec. 17, 2021.

(51) Int. Cl.
*H03K 17/92*    (2006.01)
*H03K 5/1252*   (2006.01)

(52) U.S. Cl.
CPC ........... *H03K 17/92* (2013.01); *H03K 5/1252* (2013.01)

(58) Field of Classification Search
CPC ...... H03K 17/92; H03K 5/1252; B82Y 10/00; H10N 60/12; H10N 69/00; G06N 10/40
See application file for complete search history.

(56) References Cited

U.S. PATENT DOCUMENTS

| 6,128,764 A | 10/2000 | Gottesman |
| 6,157,044 A | 12/2000 | Nakanishi et al. |

(Continued)

FOREIGN PATENT DOCUMENTS

| EP | 1085422 A2 | 3/2001 |
| EP | 3665624 B1 | 4/2024 |

(Continued)

OTHER PUBLICATIONS

Aassime et al., "Radio-frequency Single-electron Transistor as Readout Device for Qubits: charge sensitivity and backaction", Phys Rev Lett 86, pp. 3376-3379, 2001.

(Continued)

*Primary Examiner* — Jung Kim
(74) *Attorney, Agent, or Firm* — Cozen O'Connor

(57) ABSTRACT

A method of generating a coupling gate between qubits and a superconducting integrated circuit providing a pulse source are discussed. The method includes energizing a power line connected to a pulse source, applying a signal to a control line in communication with a coupler, the coupler in communication between the two qubits, and applying a second signal to a control line in communication with a resonator. The method further includes inducing a tone on a transmission line that selectively communicates with the resonator to bias the resonator, the resonator coupling a signal to the pulse source in combination with the power line, and applying a third signal to a pulse source control line in communication with the pulse source, the pulse source (Continued)

applying a pulse to the coupler in response to the third signal to couple the two qubits for a duration of the coupling gate.

20 Claims, 13 Drawing Sheets

(56) References Cited

U.S. PATENT DOCUMENTS

| | | | |
|---|---|---|---|
| 6,169,981 | B1 | 1/2001 | Werbos |
| 6,317,766 | B1 | 11/2001 | Grover |
| 6,360,112 | B1 | 3/2002 | Mizuno et al. |
| 6,459,097 | B1 | 10/2002 | Zagoskin |
| 6,504,172 | B2 | 1/2003 | Zagoskin et al. |
| 6,563,310 | B2 | 5/2003 | Zagoskin |
| 6,563,311 | B2 | 5/2003 | Zagoskin |
| 6,605,822 | B1 | 8/2003 | Blais et al. |
| 6,614,047 | B2 | 9/2003 | Tzalenchuk et al. |
| 6,627,915 | B1 | 9/2003 | Ustinov et al. |
| 6,627,916 | B2 | 9/2003 | Amin et al. |
| 6,633,053 | B1 | 10/2003 | Jaeger |
| 6,649,929 | B2 | 11/2003 | Newns et al. |
| 6,728,131 | B2 | 4/2004 | Ustinov |
| 6,753,546 | B2 | 6/2004 | Tzalenchuk et al. |
| 6,803,599 | B2 | 10/2004 | Amin et al. |
| 6,838,694 | B2 | 1/2005 | Esteve et al. |
| 6,885,325 | B2 | 4/2005 | Omelyanchouk et al. |
| 6,900,454 | B2 | 5/2005 | Blais et al. |
| 6,911,664 | B2 | 6/2005 | Il et al. |
| 6,919,579 | B2 | 7/2005 | Amin et al. |
| 6,936,841 | B2 | 8/2005 | Amin et al. |
| 6,943,368 | B2 | 9/2005 | Amin et al. |
| 6,978,070 | B1 | 12/2005 | McCarthy et al. |
| 6,979,836 | B2 | 12/2005 | Zagoskin et al. |
| 6,984,846 | B2 | 1/2006 | Newns et al. |
| 7,002,174 | B2 | 2/2006 | Il et al. |
| 7,015,499 | B1 | 3/2006 | Zagoskin |
| 7,133,888 | B2 | 11/2006 | Kohn et al. |
| 7,135,701 | B2 | 11/2006 | Amin et al. |
| 7,230,266 | B2 | 6/2007 | Hilton et al. |
| 7,253,654 | B2 | 8/2007 | Amin |
| 7,307,275 | B2 | 12/2007 | Lidar et al. |
| 7,335,909 | B2 | 2/2008 | Amin et al. |
| 7,533,068 | B2 | 5/2009 | Maassen et al. |
| 7,605,600 | B2 | 10/2009 | Harris |
| 7,613,764 | B1 | 11/2009 | Hilton et al. |
| 7,624,088 | B2 | 11/2009 | Johnson et al. |
| 7,639,035 | B2 | 12/2009 | Berkley |
| 7,843,209 | B2 | 11/2010 | Berkley |
| 7,876,248 | B2 | 1/2011 | Berkley et al. |
| 7,880,529 | B2 | 2/2011 | Amin |
| 7,898,282 | B2 | 3/2011 | Harris et al. |
| 8,098,179 | B2 | 1/2012 | Bunyk et al. |
| 8,102,185 | B2 | 1/2012 | Johansson et al. |
| 8,169,231 | B2 | 5/2012 | Berkley |
| 8,190,548 | B2 | 5/2012 | Choi |
| 8,195,596 | B2 | 6/2012 | Rose et al. |
| 8,421,053 | B2 | 4/2013 | Bunyk et al. |
| 8,536,566 | B2 | 9/2013 | Johansson et al. |
| 8,611,974 | B2 | 12/2013 | Maibaum et al. |
| 8,644,898 | B1 | 2/2014 | De Andrade et al. |
| 8,854,074 | B2 | 10/2014 | Berkley |
| 8,951,808 | B2 | 2/2015 | Ladizinsky et al. |
| 9,015,215 | B2 | 4/2015 | Berkley et al. |
| 9,495,644 | B2 | 11/2016 | Chudak et al. |
| 9,870,277 | B2 | 1/2018 | Berkley |
| 10,037,493 | B2 | 7/2018 | Harris et al. |
| 10,068,180 | B2 | 9/2018 | Amin et al. |
| 10,312,141 | B2 | 6/2019 | Kirby et al. |
| 10,528,886 | B2 | 1/2020 | Boothby |
| 10,552,755 | B2 | 2/2020 | Lanting et al. |
| 10,938,346 | B2 | 3/2021 | Berkley et al. |
| 11,127,893 | B2 | 9/2021 | Johnson et al. |
| 11,182,230 | B2 | 11/2021 | Berkley et al. |
| 11,424,521 | B2 | 8/2022 | Whittaker et al. |
| 11,494,683 | B2 | 11/2022 | Amin et al. |
| 2002/0060635 | A1 | 5/2002 | Gupta |
| 2002/0179937 | A1 | 12/2002 | Ivanov et al. |
| 2002/0180006 | A1 | 12/2002 | Franz et al. |
| 2003/0016069 | A1 | 1/2003 | Furuta et al. |
| 2004/0016918 | A1 | 1/2004 | Amin et al. |
| 2004/0071019 | A1 | 4/2004 | Magnus et al. |
| 2005/0047245 | A1 | 3/2005 | Furuta et al. |
| 2006/0147154 | A1 | 7/2006 | Thom et al. |
| 2009/0153381 | A1* | 6/2009 | Kirichenko ........... H03M 3/408 341/143 |
| 2009/0322374 | A1 | 12/2009 | Przybysz et al. |
| 2012/0124432 | A1 | 5/2012 | Pesetski et al. |
| 2014/0229722 | A1 | 8/2014 | Harris |
| 2015/0219730 | A1 | 8/2015 | Tsukamoto et al. |
| 2015/0263736 | A1 | 9/2015 | Herr et al. |
| 2016/0079968 | A1 | 3/2016 | Strand et al. |
| 2016/0335558 | A1 | 11/2016 | Bunyk et al. |
| 2017/0256698 | A1 | 9/2017 | Nayfeh et al. |
| 2018/0054201 | A1 | 2/2018 | Reagor et al. |
| 2018/0247217 | A1 | 8/2018 | Heeres et al. |
| 2018/0341874 | A1 | 11/2018 | Puri et al. |
| 2019/0019098 | A1 | 1/2019 | Przybysz |
| 2019/0164959 | A1 | 5/2019 | Thomas et al. |
| 2019/0237648 | A1 | 8/2019 | Przybysz et al. |
| 2019/0392878 | A1 | 12/2019 | Murduck et al. |
| 2020/0036332 | A1 | 1/2020 | Abdo |
| 2020/0090738 | A1 | 3/2020 | Naaman et al. |
| 2020/0401649 | A1 | 12/2020 | Lanting |
| 2021/0013391 | A1 | 1/2021 | Johnson et al. |
| 2021/0073667 | A1 | 3/2021 | Harris |
| 2021/0190885 | A1 | 6/2021 | Swenson et al. |
| 2021/0248506 | A1 | 8/2021 | Hoskinson et al. |
| 2022/0123048 | A1 | 4/2022 | Swenson et al. |
| 2023/0027682 | A1 | 1/2023 | Molavi et al. |
| 2023/0106489 | A1 | 4/2023 | Harris |
| 2023/0370069 | A1 | 11/2023 | Amin et al. |

FOREIGN PATENT DOCUMENTS

| | | |
|---|---|---|
| KR | 20190015330 A | 2/2019 |
| WO | 2015013532 A1 | 1/2015 |
| WO | 2022155140 A1 | 7/2022 |
| WO | 2023004040 A1 | 1/2023 |
| WO | 2023114811 A1 | 6/2023 |
| WO | 2023219656 A2 | 11/2023 |
| WO | 2024050333 A1 | 3/2024 |
| WO | 2024102504 A2 | 5/2024 |
| WO | 2024172854 A2 | 8/2024 |

OTHER PUBLICATIONS

Allman, et al., "RFSQUID-Mediated Coherent Tunable Coupling Between a Superconducting Phase Qubit and a Lumped Element Resonator", arXiv:1001.0816v1 [cond-mat.supr-con], Jan. 6, 2010.
Al-Saidi et al., "Eigenstates of a small Josephson junction coupled to a resonant cavity", Physical Review B, 65, p. 014512-1 to 014512-7, 2001.
Amin et al., "Thermally assisted adiabatic quantum computation," arXiv:cond-mat/0609332v2, pp. 1-5, (Mar. 2, 2007) Feb. 1, 2006.
Amin, "Effect of Local Minima on Adiabatic Quantum Optimization," arXiv:0709.0528v2, Apr. 4, 2008.
Anton, et al., "Magnetic Flux Noise in dc SQUIDs: Temperature and Geometry Dependence", Physical Review Letters, PRL 110, 147002, Apr. 5, 2013.
Armour et al., "Entanglement and Decoherence of a Micromechanical Resonator via Coupling to a Cooper—Pair Box", Physical RevieW Letters, 88, pp. 148304-1 to 148301-4, 2002.
Ataides, et al., "the XZZX surface code", Nature Communications, https://doi.org/10.1038/s41467-021-22274-1, 2021, 12 pages.
Auger James M. Fault-tolerance thresholds for the surface code with fabrication errors, arXiv:1706.04912v1, Jun. 15, 2017.
Averin et al., "Quantum Computing and Quantum Measurements With Mesoscopic Josephson Junctions", Fortschritte der Physik 48, pp. 1055-1074, 2000.
Averin et al., "Variable Electrostatic Transformer: Controllable Coupling of Two Charge Qubits," Physical Review Letters 91(5):

(56) References Cited

OTHER PUBLICATIONS 057003-1-057003-4, Aug. 1, 2003. arXiv:cond-mat/0304166v1, Apr. 7, 2003.
Barends, et al., Logic Gates at the Surface Code Threshold: Superconducting Qubits Poised for Fault-tolerant Quantum Computing, 2014, arXiv: 1402.4848.
Barone et al., "Quantum Computation With Aharonov-Bohm Qubits", WWWW.arXiv.org preprint: cond-mat/0203038 v1 (Mar. 2, 2002).
Barrett, et al., "Fault Tolerant Quantum Computation with Very High Threshold for Loss Errors", Phys. Rev. Lett. 105, 200502—Published Nov. 9, 2010, 4 pages.
Baust,, Characterization of Flux-driven Josephson Parametric Amplifiers, Diploma Thesis, Technische Universitat Munchen, Aug. 2010, 119 pages.
Bell et al., "Traveling Wave Parametric Amplifier based on a chain of Coupled Asymmetric SQUIDs", arXiv:1509.04573 [cond-mat. supr-con], Sep. 15, 2015.
Bell, et al, "SQUID Based Superconducting Traveling-Wave Parametric Amplifier", IEEE/CSC & ESAS Superconductivity News Forum (global edition), Oct. 2014, 3 pages.
Benjamin, Quantum Computing Without Local Control of Qubit-Qubit Interactions, 2001, 4 pages.
Biamonte et al., "Realizable Hamiltonians for universal adiabatic quantum computers," arXiv:0704.1287v2, Jun. 17, 2008, 7 pages.
Blais et al., "Operation of universal gates in a solid-state quantum computer based on clean Josephson junctions between d-wave superconductors", Physical Review A, 61, 042308, 2000.
Blais et al., "Quantum netWork optimization", Physical RevieW A, 64, pp. 022312-1 to 022312-5 (2001).
Blais et al., "Tunable Coupling of Superconducting Qubits," arXiv:cond-mat/0207112v3 [cond-mat.mes-hall], Mar. 18, 2003, 4 pages.
Blais, et al., "Cavity quantum electrodynamics for superconducting electrical circuits an architecture for quantum computation", arXiv:cond-mat/0402216v1, Feb. 7, 2004, pp. 1-14 (Year:2004).
Blatter et al., "Design aspects of superconducting-phase quantum bits," Physical Review B 63: 174511-1-174511-9, 2001.
Bravyi et al., "The Complexity of Stoquastic Local Hamiltonian Problems," arXiv:quant-ph/0606140v4, Oct. 2, 2007, 21 pages.
Bravyi, et al., "Hight-threshold and low-overhead fault-tolerant quantum memory", arXiv:2308.07915v1 [quant-ph] Aug. 15, 2023, 38 pages.
Bravyi, et al., "Universal quantum computation with ideal Clifford gates and noisy ancillas", arXiv:quant-ph/0403025v2 Dec. 16, 2004, 15 pages.
Brennen et al., "Why should anyone care about computing with anyons?," arXiv:0704.2241v1 [quant-ph], pp. 1-12, Apr. 18, 2007.
Brown et al., "A fault-tolerant non-Clifford gate for the surface code in two dimensions", Science Advances, May 22, 2020, vol. 6, Issue 21, 25 pages.
Buisson et al., "Entangled states in a Josephson charge qubit coupled to a superconducting resonator", arXiv.org:cond/mat/0008275v1, Aug. 18, 2000.
Burkard et al., "Spintronics and Quantum Dots for Quantum Computing and Quantum Communication," Fortschritte der Physik 48, pp. 965-986, 2000.
Carelli et al., "SQUID Systems for Macroscopic Quantum Coherence and Quantum Computing", IEEE trans. Apple. Supercond., Mar. 1, 2001. https://ieeexplore.ieee.org/document/919321.
Chamberland et al, "Building a Fault-Tolerant Quantum Computer Using Concatenated Cat Codes", arXiv:2012.04108v2 [quant-ph] Jan. 27, 2022, 117 page.
Chamon, et al., "A superconducting circuit realization of combinatorial gauge symmetry", arXiv:2006.10060v1 [quant-ph] Jun. 17, 2020, 9 pages.
Chancellor et al., "Circuit design for multi-body interactions in superconducting quantum annealing systems with applications to a scalable architecture", arXiv:1603.09521v5, Oct. 13, 2017.
Chancellor, et al., "Scalable Universal Holonomic Quantum Computation Realized with an Adiabatic Quantum Data Bus and Potential Implementation Using Superconducting Flux Qubits", arXiv:1301.7100v3 [quant-ph], Mar. 21, 2013, 10 pages.
Chapman et al., "General Purpose Multiplexing Device for Cryogenic Microwave Systems," arXiv:1603.02716v2 [quant-ph] May 31, 2016, 10 pages.
Chow, et al., "Complete Universal Quantum Gate Set Approaching Fault-tolerant Thresholds with Superconducting Qubits", arXiv:1202.5344v1 [quant-ph], Feb. 23, 2012, 13 pages.
Born et al., "Fabrication of Ultrasmall Tunnel Junctions by Electron Beam Direct-Writing", IEEE, 11(1) Mar. 2001, 4 pages.
Wang, Z. L, et al., "Quantum state characterization of a fast tunable superconducting resonator," Applied Physics Letters 102, 163503 (2013), 4 pages.
Orlando et al., "Engineering the Quantum Measurement Process for the Persistent Current Qubit", Physica C 3681294-299 (Mar. 2002).
Ortlepp et al., "Access Time and Power Dissipation of a Model 256-Bit Single Flux Quantum RAM", IEEE Transactions on Applied Superconductivity, vol. 24, No. 4, Aug. 2014.
Ortlepp et al., "Design Guidelines for Suzuki Stacks as Reliable High-speed Josephson Voltage Drivers", Superconductor Science Technology, 26 (2013) 035007 (12pp).
Paik, et al., "Observation of High Coherence in Josephson Junction Qubits Measured in a Three-dimensional Circuit QED Architecture", arXiv:1105.4652v4 [quant-ph], Nov. 2, 2011.
Plastina et al. "Communicating Josephson qubits", arXiv.org:cond-mat/0206586 (2002).
Pop, et al., "Experimental Demonstration of Aharonov-Casher Interference in a Josephson Junction Circuit", arXiv:1104.3999v1 [cond-mat.mess-hall], Apr. 20, 2011.
Poyatos et al., "Schemes of Quantum Computations With Trapped Ions", Fortschritte der Physik 48, pp. 785-799, 2000.
Pudenz, et al., "Error corrected quantum annealing with hundreds of qubits", arXiv:1307.8190v1 [quant-ph] Jul. 31, 2013, 18 pages.
Puri, et al., "Quantum Annealing with All-to-all Connected Nonlinear Oscillators", Nature Communications, vol. 8, Article No. 15785, Jun. 8, 2017, 9 pages.
Raussendorf, et al., "Fault-Tolerant quantum computation with high threshold in two dimensions", arXiv:quant-ph/0610082v2, May 14, 2007, 4 pages.
Rey-de-Castro et al., "Design of an RSFQ Control Circuit to Observe MQC on an rf-Squid", IEEE Transactions on Applied Superconductivity 11, pp. 1014-1017 (2001).
Sendelbach, et al., "Complex Inductance, Excess Noise, and Surface Magnetism in dc SQUIDs", Physical Review Letters 103, 117001, Sep. 11, 2009.
Sete, et al., "Purcell Effect with Microwave Drive: Suppression of Qubit Relaxation Rate", arXiv: 1401.5545v2, Mar. 21, 2014, 15 pages.
Shi, et al., "Multiplexed control scheme for scalable quantum information processing with superconducting qubits", arXiv:2312.06911v1 [quant-ph] Dec. 12, 2023, 8 pages.
Simbierowicz, et al., "Flux-driven Josephson Parametric Amplifier for Sub-GHz Frequencies Fabricated with Side-wall Passivated Spacer Junction Technology", arXiv:1805.07307v1, May 18, 2018, 15 pages.
Spiller, "Superconducting Circuits for Quantum Computing," Fortschritte der Physik 48, pp. 1075-1094, 2000.
Tanaka et al., "DC SQUID Readout Readout for Qubit," Physica C, 3681300 304 (Mar. 2002).
Tang, et al., "Robust surface code topology against sparse fabrication defects in a superconducting-qubit array", Phys. Rev. A 93. 032322—Published Mar. 15, 2018, 4 pages.
Van der Wal et al., "Quantum Superposition of Macroscopic Persistent current states", Science 290, pp. 773-777, 2000.
VanDenBrink Mediated Tunable Coupling of Flux Qubits, New Journal of Physics 7 (2005) 230, Nov. 7, 2005.
Vandersypen et al., "Experimental realiZation of order-finding With a quantum computer", ArXiv.org:quant-ph/0007017, pp. 1-4 (2000).
Venegas-Andraca, et al., "A cross-disciplinary introduction to quantum annealing-base algorithms", Contemporary Physics, Quantum Annealing ArXiv:1803.03372v1 [puant-ph] Mar. 9, 2018, 31 pages.
Venturelli et al., "Quantum Optimization of Fully-Connected Spin Glasses", arXiv, Jun. 29, 2014.

(56) References Cited

OTHER PUBLICATIONS

Vion et al., "Manipulating the quantum state of an electrical circuit", Science, 296, pp. 886-889 (2002).
Wang, et al., "Measurement of the Decay of Fock States in a Superconducting Quantum Circuit", arXiv:0808.3279v1 [cond-mat.mess-hall], Aug. 24, 2008.
Watanabe, M. et al., "Resonance-Free Low-Pass Filters for the AC Josephson Voltage Standard," IEEE Transactions on Applied Superconductivity, 16(1), Mar. 2006, 5 pages.
Wendin et al., "Superconducting Quantum Circuits, Qubits and Computing," arXiv:cond-mat/0508729v1 [cond-mat.supr-con], Aug. 30, 2005, 60 pages.
Wenner, et al., "Catching Time-Reversed Microwave Photons with 99.4% Absorption Efficiency", arXiv:1311.1180v2 [quant-ph], Nov. 16, 2013.
White et al., "Traveling wave parametric amplifier with Josephson junctions using minimal resonator phase matching", Applied Physics Letters 106, Jun. 15, 2015.
Yamamoto, "Flux Driven Josephson Parametric Amplifier", arXiv:0808.1386v1 [cond-mat supr-con] 2008.
Yan et al., "A tunable coupling scheme for implementing high-fidelity two-qubit gates", Arxiv:1803.09813v1, Mar. 26, 2018.
Yin, et al., "Controlled Catch and Release of Microwave Photon States", arXiv:1208.2950v1 [cond-mat.supr-con], Aug. 14, 2012.
Yu et al., "Coherent temporal oscillations of macroscopic quantum states in a Josephson junction", Science, 296, pp. 889-892, 2002.
Zagoskin- Superconducting Qubits, La Physique au Canada 63(4):215-227, 2007.
Zhang et al., "Non-constant bias current for dc SQUID operation", Physica C 368, pp. 181-184, 2002.
Zhang et al., "Substrate resonator for HTS rf SQUID operation", Physica C 372-3761282-286 (2002).
Zhao, et al. "Two-photon Driven Kerr Resonator for Quantum Annealing with Three-dimensional Circuit QED", arXiv:1712.03613v2, Dec. 12, 2017, 13 pages.
Zhou et al, "Experimental Realization of Spin Liquids in a Programmable Quantum Device", arXiv:2009.07853v2, 2020.
Zorin, "Radio-Frequency Bloch-Transistor Electrometer", Phys. Rev. Lett. 86, pp. 3388-3391, 2001.
Semenov, et al., Semenov, et al., "Classical and Quantum Operation Modes of the Reversible Logic Circuits," Department of Physics and Astronomy, Stony Brook University, Stony Brook, New York, Presentation, Dec. 2006, 29 pages.
Christopher Eichler et al., 'Controlling the dynamic range of a Josephson parametric amplifier', EPJ Quantum Technology, vol. 1, No. 2, Jan. 29, 2014.
Clarke et al., "Quiet Readout of Superconducting Flux States," Physica Scripta. T102: 173-177, 2002.
Clarke et al., "Superconducting quantum bits," Nature 453:1031-1042, Jun. 19, 2008.
Cory et al., "NMR Based Quantum Information Processing: Achievements and Prospects", Fortschritte der Physik 48, pp. 875-907, 2000.
Cosmelli et al, "An Integrated System of SQUIDs for the Study of Macroscopic Quantum Coherence", Supercond. Sci. Technol. 14, 2001.
Cosmelli, C., "Controllable Flux Coupling for the Integration of Flux Qubits," arXiv:cond-mat/0403690v1 [cond-mat.supr-con]. Mar. 29, 2004, 10 pages.
Cottet et al., "Implementation of a combined charge-phase quantum bit in a superconducting circuit", Physica C 367, pp. 197-203, 2002.
Devitt, Quantum Error Correction for Beginners, arXiv: 0905.2794v4 [quant-ph], Jun. 21, 2013 2013.
Devoret et al., "Superconducting Circuits for Quantum Information: An Outlook," Science 339:1169-1174, Mar. 8, 2013.
Devoret et al., "Superconducting Qubits: A Short Review," arXiv:cond-mat/0411174v1, Nov. 7, 2004, 41 pages.
Devoret, "Josephson-based Parametric Amplifiers for Quantum Measurements", Quantum-Mechanical Electronics Lab, Applied Physics and Physics, Yale University, Nov. 9, 92 pages, 2009.
Devoret, et al., "Introduction to Quantum-limited parametric Amplification of Quantum Signals with Josephson Circuits", arXiv:1605.00539v2, May 25, 2016, 28 pages.
DiVincenzo et al., "Experimental Proposals for Quantum Computaton", H-K Lo and S.L. Braunstein (eds.), chapter 1, Wiley-VCH Verlag GmbH, Berlin (2001), also published WWW. ArXiv.org preprint: quant-ph/0002077 (Apr. 13, 2000).
Dykman, "Quantum Computing Using Electrons Floating on Liquid Helium", Fortschritte der Physik 48, pp. 1095-1108, 2000.
Economist, Quantum Dreams, Economist, pp. 1-3 (Mar. 8, 2001).
Eddins, et al, "Josephson Parametric Amplifiers: Theory and Application", Quantum Nanoelectronics Laboratory, Department of Physics, University of CA, Berkley, Workshop on Microwave Cavity Design for Axion Detection Livermore Valley Open Campus, Aug. 2015.
Farhi et al., "Quantum Adiabatic Evolution Algorithms versus Simulated Annealing," MIT-CTP #3228, arXiv:quant-ph/0201031 v1, pp. 1-16, Jan. 8, 2002.
Filippov et al., "Tunable Transformer for Qubits Based on Flux States," IEEE Transactions on Applied Superconductivity 13(2): 1-4, Jun. 2003.
Fowler, et al., "Surface codes: towards practical large-scale quantum computation", Phys. Rev. A 86, 032324—Published Sep. 18, 2012, 5 pages.
Friedman et al., "Aharonov-Casher-Effect Suppression of Macroscopic Tunneling of Magnetic Flux," arXiv:cond-mat/0109544v1 [cond-mat.mes-hall], Sep. 28, 2001, 9 pages.
Friedman et al., "Quantum superposition of distinct macroscopic states," Nature 406:43-46, Jul. 6, 2000.
Geerlings, et al., "Improving the Quality Factor of Microwave Compact Resonators by Optimizing Their Geometrical Parameters", arXiv:1204.0742v3 [cond-mat.supr-con], Jun. 5, 2012.
Ghiu et al., "Asymmetric two-output quantum processor in any dimension," arXiv:quant-ph/0610138v1, pp. 1-8, Oct. 17, 2006.
Gotz et al., "Harmonic current-phase relation in Nb-A1-based superconductor/ normal conductor/ superconductor-type Josephson junctions betWeen 4.2 K and the critical temperature", ApplPhys. Lett. 77, pp. 1354-1356 (2000).
Grangier et al., "Implementations of Quantum Computing Using Cavity Quantum Electrodynamics", Fortschritte der Physik 48, pp. 859-874, 2000.
Greenberg et al., "Low-frequency characterization of quantum tunneling in flux qubits", ArXiv.org preprint server: cond-mat/0208076, last accessed on Aug. 20, 2004.
Han et al., "Time-Resolved Measurement of Dissipation-Induced Decoherence in a Josephson Junction," Science 293:1457-1459, Aug. 24, 2001.
Harris et al., "A Compound Josephson Junction Coupler for Flux Qubits With Minimal Crosstalk," arXiv:0904.3784v3 [cond-mat.supr-con], Jul. 16, 2009, 5 pages.
Harris et al., 'A Compound Josephson Junction Coupler for Flux Qubits With Minimal Crosstalk', arXiv:0904.3784v3, Jul. 2009.
Harris et al., "Experimental Demonstration of a Robust and Scalable Flux Qubit," arXiv:0909.4321v1, Sep. 24, 2009, 20 pages.
Harris et al., "Experimental Investigation of an Eight-Qubit Unit Cell in a Superconducting Optimization Processor," arXiv:1004.1628v2, Jun. 28, 2010, 16 pages.
Harris, Sign and Magnitude Tunable Coupler for Superconducting Flux Qubits, arXiv:cond-mat/0608253v1, Aug. 11, 2006.
Hekking et al., "Cooper Pair BOX Coupled to a Current-Biased Josephson Junction", arXiv.org:cond-mat/0201284 (2002).
Hofheinz, et al., "Generation of Fock States in a Superconducting Quantum Circuit", Nature 454, pp. 310-314, Jul. 1, 2008.
Hofheinz, et al., "Synthesizing Arbitrary Quantum Staes in a Superconducting Resonator, Nature", vol. 459, pp. 546-549, May 28, 2009.
Horsman, et al., "Surface code quantum computing by lattice surgery", 2012 Journal of Physics, 14 123011, 28 pages.
Hu et al., "Decoherence and dephasing in spin-based solid state quantum computers", arXiv.org.cond-mat/0108339v2, Sep. 6, 2001, (2001).

(56) References Cited

OTHER PUBLICATIONS

Il'ichev et al., "Characterization of superconducting structures designed for qubit realizations", Appl. Phys. Lett. 80, pp. 4184-4186, 2002.
Il'ichev et al., "Degenerate Ground State in a Mesoscopic YBa2Cu3O7-x Grain Boundary Josephson Junction", Phys. Rev. Lett. 86, pp. 5369-5372, 2001.
Ettinger et al., "An Integrated 20 GHZ SiGe Bipolar Differential Oscillator with High Tuning Range", 2000.
Barends R. et al., "Coherent Josephson qubit suitable for scalable quantum integrated circuits," arXiv:1304.2322v1 [quant-ph], Apr. 8, 2013, 10 pages.
Kelly, et al., "Fault-tolerant Superconducting Qubits, Dissertations in fulfilment of Ph.D. in Physics", UC Santa Barbara, 2015.
Kjaergaard et al., "Superconducting Qubits: Current State of Play", arXiv:1905.13641v1, May 31, 2019.
Rocchetto et al., "Stabilisers as a design tool for new forms of Lechner-Hauke-Zoller Annealer", arXiv: 1603.08554 [quant-ph], May 2, 2016. https://arxiv.org/abs/1603.08554.
Wallraff, et al.,, "Circuit Quantum Electrodynamics: Coherent Coupling of a Single Photon to a Cooper Pair Box", arXiv:cond-mat/0407325v1 [cond-mat.mess-hall], Jul. 13, 2004.
Wallraff, et al., "Approaching Unit Visibility for Control of a Superconducting Qubit with Dispersive Readout", arXiv:cond-mat/0502645v1 [cond-mat.mess-hall], Feb. 27, 2005.
Il'ichev et al., "Radio-frequency based monitoring of small supercurrents", Rev. Sci. Instrum. 72, pp. 1882-1887, 2001.
Il'ichev et al., "Radio-frequency method for characterization of superconducting weak links," Physica C 350, pp. 244-248, 2001.
Ilichev, et al., "Continuous Monitoring of Rabi Oscillations in a Josephson Flux Qubit", Physical Review Letters 91(9): 097906-1-097906-4, week ending Aug. 19, 2003.
Inokuchi et al., "Analog computation using quantum-flux parametron devices," Physica C 357-360 : 1618-1621, 2001.
International Search Report and Written Opinion for PCT/US2022/081507 dated Apr. 24, 2023, 12 pages.
James et al., "Scanning Hall probe Microscope images of Field penetration into niobium fields", Physica C 332, pp. 445-449, 2000.
Johnson, et al; "A scalable control system for a superconducting adiabatic quantum optimization processor", Superconductor Science and Technology; IOP Publishing; Supercond. Sci. Technol. 23 (2010); vol. 23, No. 6, Jun. 1, 2010, 12 pages.
Jones et al., Tunable electromagnetic environment for supercomputing, Jun. 13, 2013, Scientific Reports, pp. 1-5 (Year:2013).
Jonker et al., "On quantum and classical computing with arrays of superconducting persistent current qubits", Proceedings fifth IEEE International workshop on computer architectures for machine perception, Padova, italy, 11-13 Spe 2000, pp. 69-78.
Jordan, et al., "Perturbative Gadgets at Arbitrary Orders", arXiv:0802.1874v4 [quant-ph], Jan. 31, 2012.
Kane et al., "Silicon-based Quantum Computation", Fortschritte der Physik 48, pp. 1023-1041, 2000.
Knill , QC Threshold Analysis 2004.
Knill, Fault-Tolerant Postselected Quantum Computation: Schemes, arXiv:quant-ph/0402171v1, Feb. 23, 2004, 17 pages.
Krech, "Linear Microwave Response of a Charge-Type Qubit", IEEE Trans. Appl. Supercond. 11, pp. 1022-1025, 2001.
Kulik et al., "Quantum Computational Gates With Radiation Free Couplings", WWW.arXiv.org preprint1 cond-mat/0203313 v1 (Mar. 14, 2002).
LaForestFlux-vector Model of Spin Noise in Superconducting Circuits: Electron Versus Nuclear Spins and Role of Phase Transition, arXiv: 1501.03776v3 [cond-mat.supr-con], Jul. 21, 2015, 2015.
Lanting, Evidence for Temperature Dependent Spin-diffusion as a Mechanism of Intrinsic Flux Noise in SQUIDs, arXiv:1306.1512v3 [cond-mat.supr-con], Dec. 23, 2013.
Lechner et al., "A quantum annealing architecture with all-to-all connectivity from local interactions", Science Advances., vol. 1, No. 19, Oct. 23, 2015.
Levitov, et al., "Quantum Spin Chains and Majorana States in Arrays of Coupled Qubits," arXiv:cond-mat/0108266v2 [cond-mat.mes-hall]. Aug. 19, 2001, 7 pages.
Lidar , Towards Fault Tolerant Adiabatic Quantum Computation, arXiv: 0707.0021v3 [quant-ph], May 2, 2008.
Lidar et al., "Quantum Codes for Simplifying Design and Suppressing Decoherence in Superconducting Phase-Qubits", Quant Inf. Proc. 1, pp. 155-182, 2002.
Lidar et al., "Reducing Constraints on Quantum Computer Design by Encoded Selective Recoupling", Phys. Rev. Lett. 88, 017905, pp. 1-4, 2002.
Litinski, et al., "A Game of Surface Codes: Large-Scale Quantum Computing with Lattice Surgery", arXuv:1808.0289.02892v3 [quant=ph] Feb. 3, 2019, 37 pages.
Macklin, et al., "A near-quantum-limited Josephson traveling-wave parametric amplifier", Science Sciencemag. org,, Oct. 16, 2015 vol. 350, Issue 6258, 5 pages.
Majer et al., "Simple phase bias for superconducting circuits", Applied Physics Letters 80 pp. 3638-3640, 2002.
Makhlin et al., "Josephson-Junction Qubits", Fortschritte der Physik 48, pp. 1043-1054, 2000.
Makhlin et al., "Nano-electronic circuits as quantum bits", ISACS 2000 Geneva. IEEE International Symposium on Circuits and Systems. Emerging Technologies of the 21st century Geneva, Switzerland, Mar. 28-32, 2000, pp. 241-244 vol. 2, Mar. 1, 2000.
Makhlin et al., "Quantum-state engineering with Josephson-junction devices", arXIv:cond-mat/0011269v1, Nov. 15, 2000.
Manucharyan et al., "Fluxonium: single Cooper pair circuit free of charge offsets", arXiv:0906.0831v2, [cond-mat.mes-hall] Oct. 20, 2009, 13 pages.
Marquardt et al., "Superposition of tWo mesoscopically distinct quantum states: Coupling a Cooper-pair box to a large superconducting island", Physical Review B, 63, pp. 054514-054520 (2001).
Martinis et al., "Rabi Oscillations in a Large Josephson-Junction Qubit," Physical Review Letters 89(11):117901-1-117901-4, Sep. 9, 2002.
Martinis, "Superconducting phase qubits," Quantum Inf Process 8:81-103, 2009.
Mc Hugh et al., "A quantum computer using a trapped-ion spin molecule and microwave radiation," arXiv:quant-ph/0310015v2, pp. 1-9, Apr. 13, 2004.
Mizuta, et al., "Quantum and Tunnelling Capacitance in Charge and Spin Qubits", arXiv:1604.02884v2 [cond-mat.mes-hall] Aug. 16, 2016, 9 pages.
Naaman et al., "On-Chip Josephson Junction Microwave Switch," arXiv:1512.01484v1, 10 pages, 2015.
Nagayama, et al., "Sureface code error correction on a defective lattice", IOP Publishing, New J. Phys. 19 (2017) 29 pages.
Neill, "A path towards quantum supremacy with superconducting qubits", PhD Thesis—University of California, Dec. 1, 2017.
Neven, "Suppressing quantum errors by scaling a surface code logical qubit", arXiv:2207.06431v1 [quant-ph] Jul. 13, 2022, 44 pages.
Nguyen et al, "Scalable High-Performance Fluxonium Quantum Processor", arXiv:2201.09374v2 [quant-ph] Feb. 5, 2022, 29 pages.
Orlando et al, "Flux-based Superconducting Qubits for Quantum Computation" Physica C 372-376, 194-200, 2002.

* cited by examiner

SYSTEMS AND METHODS FOR QUBIT CONTROL

CROSS-REFERENCE TO RELATED APPLICATION

This patent application claims priority of U.S. Patent Application No. 63/265,605, filed on Dec. 17, 2021, the entire disclosure of which is hereby incorporated by reference herein for all purposes.

FIELD

This disclosure generally relates to coupling qubits in a quantum processor, and in particular to systems and methods for coupling qubits with coupling gates and providing control pulses.

BACKGROUND

Quantum Devices

Quantum devices are structures in which quantum mechanical effects are observable. Quantum devices include circuits in which current transport is dominated by quantum mechanical effects. Such devices include spintronics, and superconducting circuits. Both spin and superconductivity are quantum mechanical phenomena. Quantum devices can be used for measurement instruments, in computing machinery, and the like.

Quantum Computation

A quantum computer is a system that makes direct use of at least one quantum-mechanical phenomenon, such as superposition, tunneling, and entanglement, to perform operations on data. The elements of a quantum computer are qubits. Quantum computers can provide speedup for certain classes of computational problems such as computational problems simulating quantum physics.

Superconducting Qubits

Superconducting qubits are solid state qubits based on circuits of superconducting materials. Operation of superconducting qubits is based on the underlying principles of magnetic flux quantization, and Josephson tunneling. Superconducting effects can be present in different configurations, and can give rise to different types of superconducting qubits including flux, phase, charge, and hybrid qubits. The different configurations can vary in the topology of the loops, the placement of the Josephson junctions, and the physical parameters of elements of the superconducting circuits, such as inductance, capacitance, and Josephson junction critical current.

Qubits can be used as fundamental units of information for a quantum computer. A qubit contains two discrete physical states, which can also be labeled "0" and "1". Physically these two discrete states are represented by two different and distinguishable physical states of a quantum information storage device. For instance, these two discrete states can be represented by direction of magnetic field. If the physical quantity that stores these states behaves quantum mechanically, the device can additionally be placed in a superposition of 0 and 1. That is, the qubit can exist in both a "0" and "1" state at the same time, and so can perform a computation on both states simultaneously.

During quantum computation, the state of a qubit, in general, is a superposition of basis states so that the qubit has a nonzero probability of occupying the $|0\rangle$ basis state and a simultaneous nonzero probability of occupying the $|1\rangle$ basis state. The quantum nature of a qubit is largely derived from its ability to exist in a coherent superposition of basis states. A qubit will retain this ability to exist as a coherent superposition of basis states when the qubit is sufficiently isolated from sources of decoherence.

To complete a computation using a qubit, the state of the qubit is measured (i.e., read out). Typically, when a measurement of the qubit is performed, the quantum nature of the qubit is temporarily lost, and the superposition of basis states collapses to either the $|0\rangle$ basis state or the $|1\rangle$ basis state thus regaining its similarity to a conventional bit. The actual state of the qubit after it has collapsed depends on its $|0\rangle$ basis state or the $|1\rangle$ basis state probabilities (i.e., quantum state probabilities) immediately prior to the readout operation.

Quantum Annealing

Quantum annealing is a computational method that may be used to find a low-energy state of a system, typically preferably the ground state of the system. Similar in concept to classical simulated annealing, the method relies on the underlying principle that natural systems tend towards lower energy states because lower energy states are more stable. Quantum annealing may use quantum effects, such as quantum tunneling, as a source of delocalization to reach an energy minimum more accurately and/or more quickly than classical annealing.

Circuit Model Quantum Computing

The quantum circuit model of computation uses quantum logic gates to form quantum circuits for problem solving. A network of quantum logic gates may be formed to describe a particular computation.

One type of quantum circuit model quantum computation is referred to as surface code, with logical qubits being simultaneously stored and manipulated as topological defects. In surface code there is no fixed Hamiltonian to restrict the subspace. Instead, each term in the Hamiltonian is treated as a stabilizer and by projective measurements of the stabilizers, the protected subspace is enforced and any leakage from the subspace is detected as an error and corrected.

The foregoing examples of the related art and limitations related thereto are intended to be illustrative and not exclusive. Other limitations of the related art will become apparent to those of skill in the art upon a reading of the specification and a study of the drawings.

BRIEF SUMMARY

According to an aspect, there is provided a method of generating a coupling gate between two qubits, the method comprising energizing a power line connected to a pulse source comprising a compound Josephson junction interrupting a superconducting loop, applying a first biasing signal to a coupler control line in communication with a coupler, the coupler in communication between the two qubits, applying a second biasing signal to a resonator control line in communication with a resonator, inducing a tone on a transmission line that selectively communicates with the resonator to bias the resonator, the resonator coupling a signal to the pulse source in combination with the energized power line, and applying a third biasing signal to a pulse source control line in communication with the pulse source, the pulse source applying a pulse to the coupler in response to the third biasing signal to couple the two qubits for a duration of the coupling gate.

According to other aspects, energizing a power line connected to a pulse source may comprise energizing a power line connected to a first pulse source and a second pulse source in series, each pulse source in communication with the coupler, and applying a third biasing signal to a pulse source control line in communication with the pulse source may comprise applying a third biasing signal to a first pulse source control line in communication with the first pulse source and applying a fourth biasing signal to a second pulse source control line in communication with the second pulse source, applying a third biasing signal and applying a fourth biasing signal may occur simultaneously to apply the pulse to the coupler, applying a third biasing signal and applying a fourth biasing signal may occur with a delay between the third biasing signal and the fourth biasing signal such that the duration of the coupling gate is determined by the delay, applying a third biasing signal to a pulse source control line in communication with the pulse source, the pulse source applying a pulse to the coupler in response to the third biasing signal may comprise moderating an amplitude and a duration of the coupling gate by a filter in the pulse source, applying a third biasing signal to the first pulse source control line in communication with the first pulse source may comprise moderating an amplitude and a duration of the coupling gate by a first filter in the first pulse source and applying a fourth biasing signal to the second pulse source control line in communication with the second pulse source may comprise moderating the amplitude and the duration of the coupling gate by a second filter in the second pulse source, applying a second biasing signal to a resonator control line in communication with a resonator may comprise applying a second biasing signal to a resonator control line in communication with one or more superconducting quantum interference devices (SQUIDs), and applying a signal to a control line in communication with a quantum flux parametron (QFP), the QFP in communication with the resonator and the pulse source, such that the resonator coupling a signal to the pulse source may comprise the resonator coupling a signal to the QFP and the QFP coupling a signal to the pulse source in combination with the energized power line.

According to an aspect, there is provided a superconducting integrated circuit comprising a first qubit, a second qubit, a coupler in communication with the first qubit and the second qubit, the coupler selectively coupling the first qubit with the second qubit, a first pulse source in communication with the coupler, the first pulse source comprising a superconducting loop, a compound Josephson junction interrupting the superconducting loop, and one or more control lines in communication with the compound Josephson junction, a resonator in communication with the first pulse source, and a transmission line in communication with the resonator.

According to other aspects, the first pulse source may comprise a filter, the superconducting integrated circuit may further comprise one or more quantum flux parametrons (QFPs) in communication with the resonator and the first pulse source, the one or more QFPs providing the communication between the resonator and the first pulse source, may further comprise a second pulse source in communication with the coupler and the one or more QFPs, and may further comprise a second pulse source in communication with the coupler, each of the first pulse source and the second pulse source may comprise a respective filter, the first qubit and the second qubit may comprise a respective superconducting loop interrupted by at least one Josephson junction, the superconducting loop comprising a body inductance, the body inductance may comprise a series of Josephson junctions and may comprise high kinetic inductance material, the transmission line may comprise one or more filters, the resonator may comprise a coupling capacitor in communication with the transmission line and a body capacitor in parallel with one or more superconducting quantum interference devices (SQUIDs), one of the one or more SQUIDs may be in communication with the first pulse source, the resonator may comprise a body inductance and the first pulse source is inductively coupled to the body inductance, the coupler may inductively couple the first qubit with the second qubit, and the coupler may capacitively couple the first qubit with the second qubit.

According to an aspect, there is provided a superconducting integrated circuit comprising a first compound Josephson junction (CJJ), a first control line in communication with the first CJJ, and a first superconducting current path interrupted by the first CJJ, the first superconducting current path comprising a transmission line in communication with a target device, a filter in series with the transmission line, and a resistor in series with the transmission line.

According to other aspects, the first control line in communication with the first CJJ may comprise a first power control line galvanically coupled to the first CJJ and a first trigger control line inductively coupled to the first CJJ, the filter may comprise one or more resistors and one or more inductors, the filter may comprise a series of damped spirals comprising a low pass filter, the transmission line may be communicatively coupled to a qubit, the qubit may comprise a qubit CJJ, and the transmission line may be magnetically coupled to the qubit CJJ, the superconducting integrated circuit may further comprise a second CJJ, a second control line in communication with the second CJJ, a superconducting loop interrupted by the second CJJ, a third CJJ inductively coupled to the superconducting loop, a third control line in communication with the third CJJ, and a second superconducting current path interrupted by the third CJJ, the second superconducting current path comprising one or more additional transmission lines, at least one of the one or more additional transmission lines communicatively coupled to the first CJJ, the second control line in communication with the second CJJ may comprise a second power control line galvanically coupled to the second CJJ and a second trigger control line inductively coupled to the second CJJ, the third control line in communication with the third CJJ may comprise a third power control line galvanically coupled to the third CJJ and a third trigger control line inductively coupled to the third CJJ, the second superconducting current path may comprise one or more additional filters and one or more additional resistors in series with the one or more additional transmission lines, the one or more additional filters may comprise one or more resistors and one or more inductors, the one or more additional filters may comprise a series of damped spirals comprising a low pass filter, and the second superconducting current path may comprise two or more additional transmission lines, a first one of the two or more additional transmission lines communicatively coupled to the first CJJ and a second one of the two or more additional transmission lines communicatively coupled to a fourth CJJ of a device, the device comprising a fourth control line in communication with the fourth CJJ and a fourth superconducting current path interrupted by the fourth CJJ, the fourth superconducting current path comprising a fourth transmission line in communication with a second target device, a fourth filter in series with the fourth transmission line, and a fourth resistor in series with the fourth transmission line.

According to an aspect, there is provided a method of delivering a control pulse through a pulse source, the method comprising increasing a current in a control line to a threshold such that a compound Josephson junction (CJJ)

transitions to a voltage state, charging a transmission line from the CJJ, delivering a control pulse to a device in communication with the transmission line, and dissipating energy stored in the transmission line through a resistor to reset the pulse source.

According to other aspects, increasing the current in a control line to a threshold may comprise increasing the current in two control lines to achieve a combined current at the threshold, delivering a control pulse to a device in communication with the transmission line may comprise delivering a control pulse to one or more qubits in communication with the transmission line, an evolution of the one or more qubits being stopped by the control pulse, and delivering a control pulse to a device in communication with the transmission line may comprise delivering a control pulse to a coupler to produce a coupling gate.

According to an aspect, there is provided a method of operating a synchronized control quench source, the method comprising increasing a current in a plurality of pulse source control lines to a first threshold, the plurality of pulse source control lines in communication with respective pulse sources, each pulse source having a respective pulse compound Josephson junction (CJJ), increasing the current through a trigger control line for a trigger source to a second threshold, the trigger source having a trigger CJJ, increasing the current through a programming source control line for a programming source to a third threshold, the programming source having a programming CJJ, the third threshold selected such that the programming CJJ transitions and provides a flux quantum to a line inductively coupled to the trigger CJJ such that the trigger CJJ transitions, charging a plurality of trigger transmission lines from the trigger CJJ, each trigger transmission line galvanically coupled to the trigger CJJ and inductively coupled to a respective pulse CJJ, transitioning each pulse CJJ by the charged trigger transmission lines, charging a plurality of pulse source transmission lines from the pulse CJJs, the plurality of pulse source transmission lines galvanically coupled to a respective one of the pulse CJJs, delivering a plurality of control pulses to a plurality of devices, each device of the plurality of devices in communication with a respective one of the plurality of pulse source transmission lines, and dissipating energy stored in the plurality of pulse source transmission lines.

According to other aspects, dissipating the energy stored in the plurality of pulse source transmission lines may comprise dissipating the energy through a plurality of resistors, each resistor of the plurality of resistors connected to a respective one of the plurality of pulse source transmission lines, delivering a plurality of control pulses to a plurality of devices may comprise delivering a plurality of control pulses to a plurality of qubits, an evolution of the plurality of qubits being stopped by the control pulse, the method may further comprise programming the plurality of qubits into a desired pre-quench state prior to delivering the plurality of control pulses, the method may further comprise reading out a state of the plurality of qubits, delivering a plurality of control pulses to a plurality of devices may comprise delivering a plurality of control pulses to a plurality of couplers to produce a plurality of coupling gates, increasing the current in the plurality of pulse source control lines may comprise increasing the current in a plurality of first and second pulse source control lines to achieve a combined current at the first threshold, each first pulse source control line being galvanically coupled to the respective pulse CJJ and each second pulse source control line being inductively coupled to the respective pulse CJJ, increasing the current through a trigger control line may comprise increasing the current in first and second trigger source control lines to achieve a combined current at the second threshold, the first trigger source control line being galvanically coupled to the trigger source CJJ and the second trigger source control line being inductively coupled to the trigger source CJJ, increasing the current through a programming source control line may comprise increasing the current in first and second programming source control lines to achieve a combined current at the third threshold, the first programming source control line being galvanically coupled to the programming CJJ and the second programming source control line being inductively coupled to the programming CJJ, the method may further comprise resetting the programming source by dissipating energy through a resistor, and delivering a plurality of control pulses to a plurality of devices may comprise delivering a plurality of control pulses to a plurality of devices simultaneously.

In other aspects, the features described above may be combined together in any reasonable combination as will be recognized by those skilled in the art.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure, or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

Example Computing System

Figure 1:
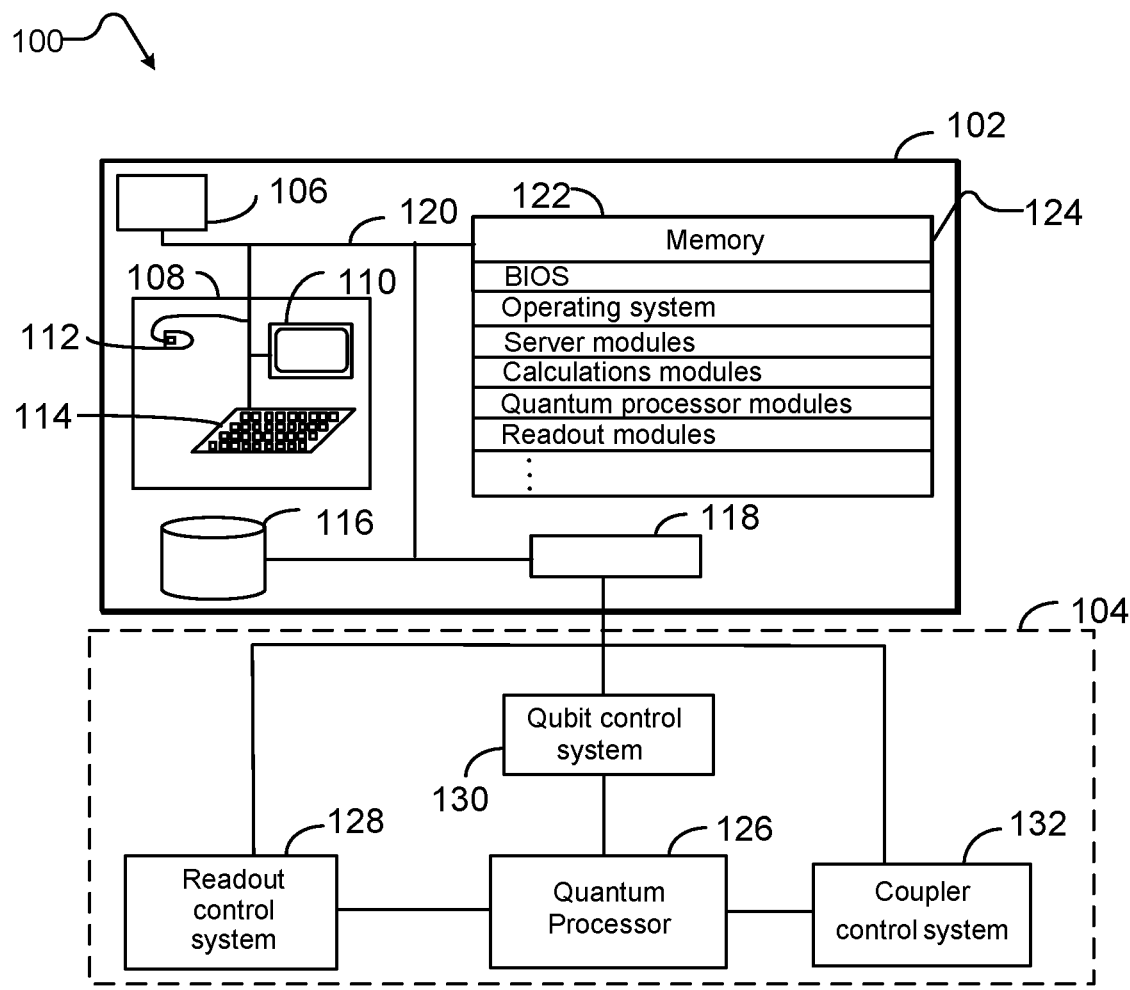
FIG. 1 is a schematic diagram of a hybrid computing system including a digital computer coupled to an analog computer, in accordance with the present systems, devices, and methods.

FIG. 1 illustrates a computing system 100 comprising a digital computer 102. The example digital computer 102 includes one or more digital processors 106 that may be used to perform classical digital processing tasks. Digital computer 102 may further include at least one system memory 122, and at least one system bus 120 that couples various system components, including system memory 122 to digital processor(s) 106. System memory 122 may store one or more sets of processor-executable instructions, which may be referred to as modules 124.

The digital processor(s) 106 may be any logic processing unit or circuitry (for example, integrated circuits), such as one or more central processing units ("CPUs"), graphics processing units ("GPUs"), digital signal processors ("DSPs"), application-specific integrated circuits ("ASICs"), programmable gate arrays ("FPGAs"), programmable logic controllers ("PLCs"), etc., and/or combinations of the same.

In some implementations, computing system 100 comprises an analog computer 104 which may include one or more quantum processors 126. Quantum processor 126 may include at least one superconducting integrated circuit. Digital computer 102 may communicate with analog computer 104 via, for instance, a controller 118. Certain computations may be performed by analog computer 104 at the instruction of digital computer 102, as described in greater detail herein.

Digital computer 102 may include a user input/output subsystem 108. In some implementations, the user input/output subsystem includes one or more user input/output components such as a display 110, mouse 112, and/or keyboard 114.

System bus 120 may employ any known bus structures or architectures, including a memory bus with a memory controller, a peripheral bus, and a local bus. System memory 122 may include non-volatile memory, such as read-only memory ("ROM"), static random-access memory ("SRAM"), Flash NAND; and volatile memory such as random-access memory ("RAM") (not shown).

Digital computer 102 may also include other non-transitory computer- or processor-readable storage media or non-volatile memory 116. Non-volatile memory 116 may take a variety of forms, including: a hard disk drive for reading from and writing to a hard disk (for example, a magnetic disk), an optical disk drive for reading from and writing to removable optical disks, and/or a solid-state drive (SSD) for reading from and writing to solid state media (for example NAND-based Flash memory). Non-volatile memory 116 may communicate with digital processor(s) via system bus 120 and may include appropriate interfaces or controllers 118 coupled to system bus 120. Non-volatile memory 116 may serve as long-term storage for processor- or computer-readable instructions, data structures, or other data (sometimes called program modules or modules 124) for digital computer 102.

Although digital computer 102 has been described as employing hard disks, optical disks and/or solid-state storage media, those skilled in the relevant art will appreciate that other types of nontransitory and non-volatile computer-readable media may be employed. Those skilled in the relevant art will appreciate that some computer architectures employ nontransitory volatile memory and nontransitory non-volatile memory. For example, data in volatile memory may be cached to non-volatile memory. Or a solid-state disk that employs integrated circuits to provide non-volatile memory.

Figure 7:
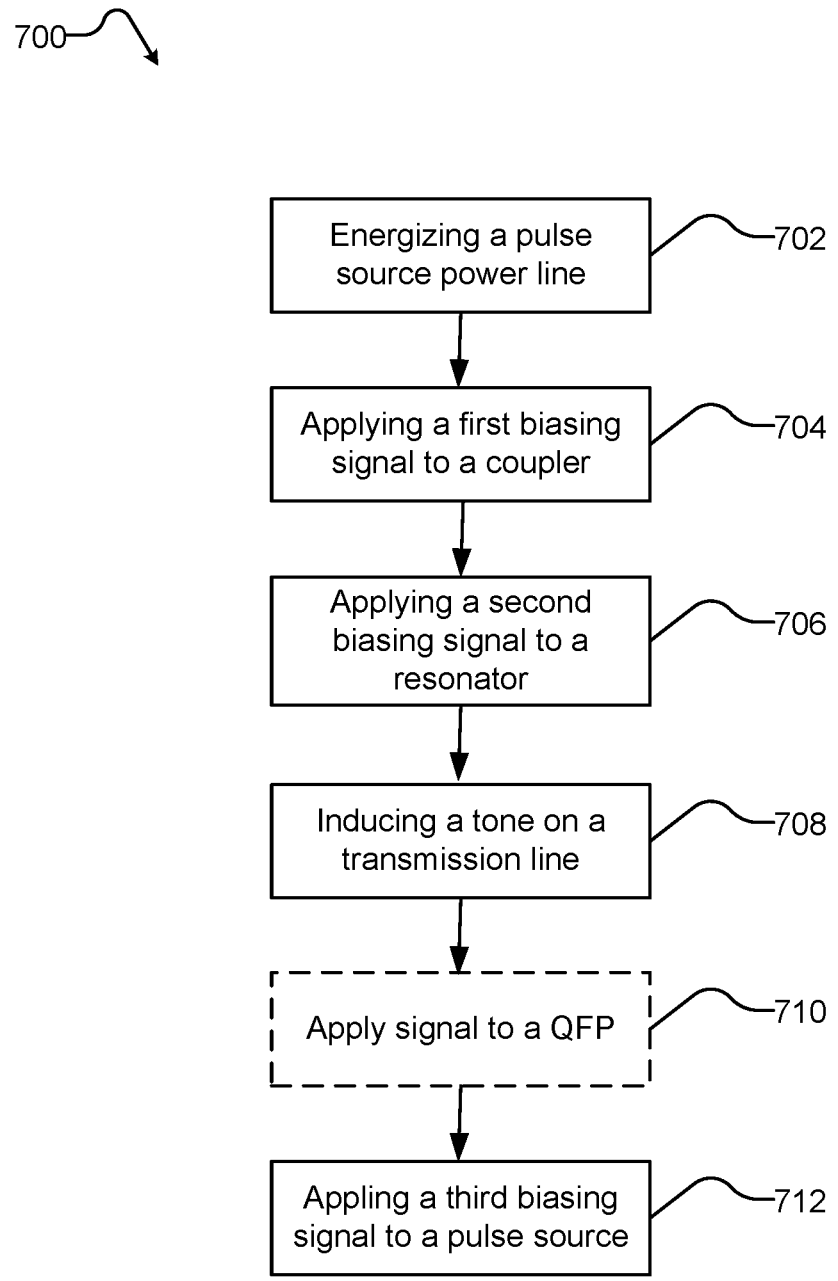
FIG. 7 is a flow chart of a method of generating a coupling gate between two qubits.
Figure 11:
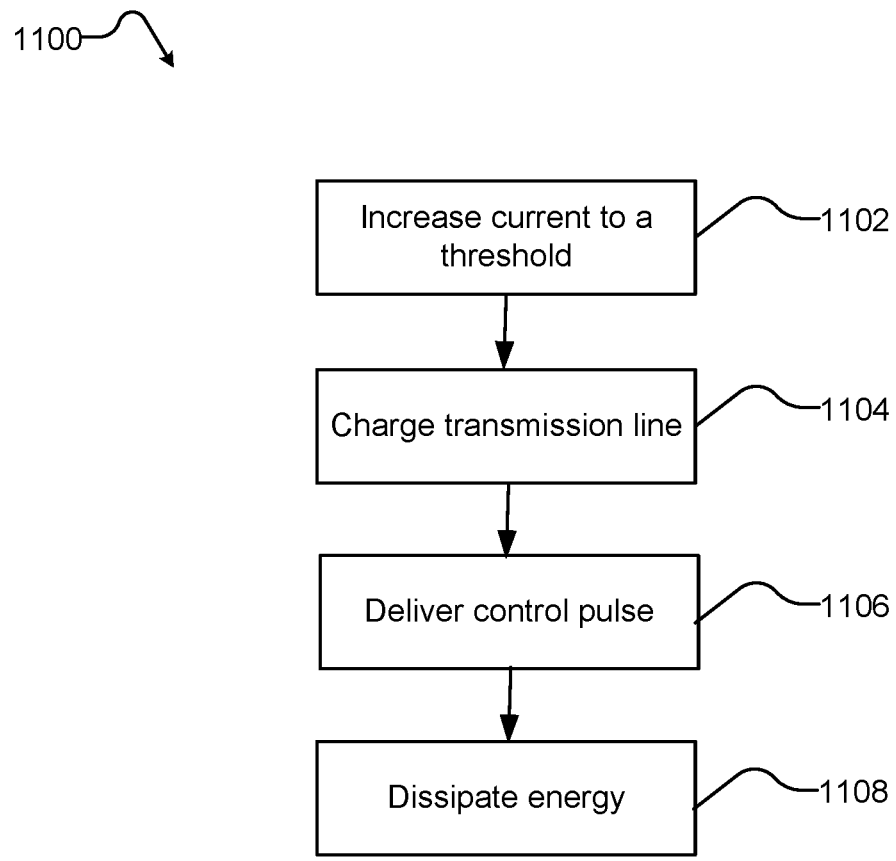
FIG. 11 is a flow chart of a method of generating a pulse from a pulse source.
Figure 12:
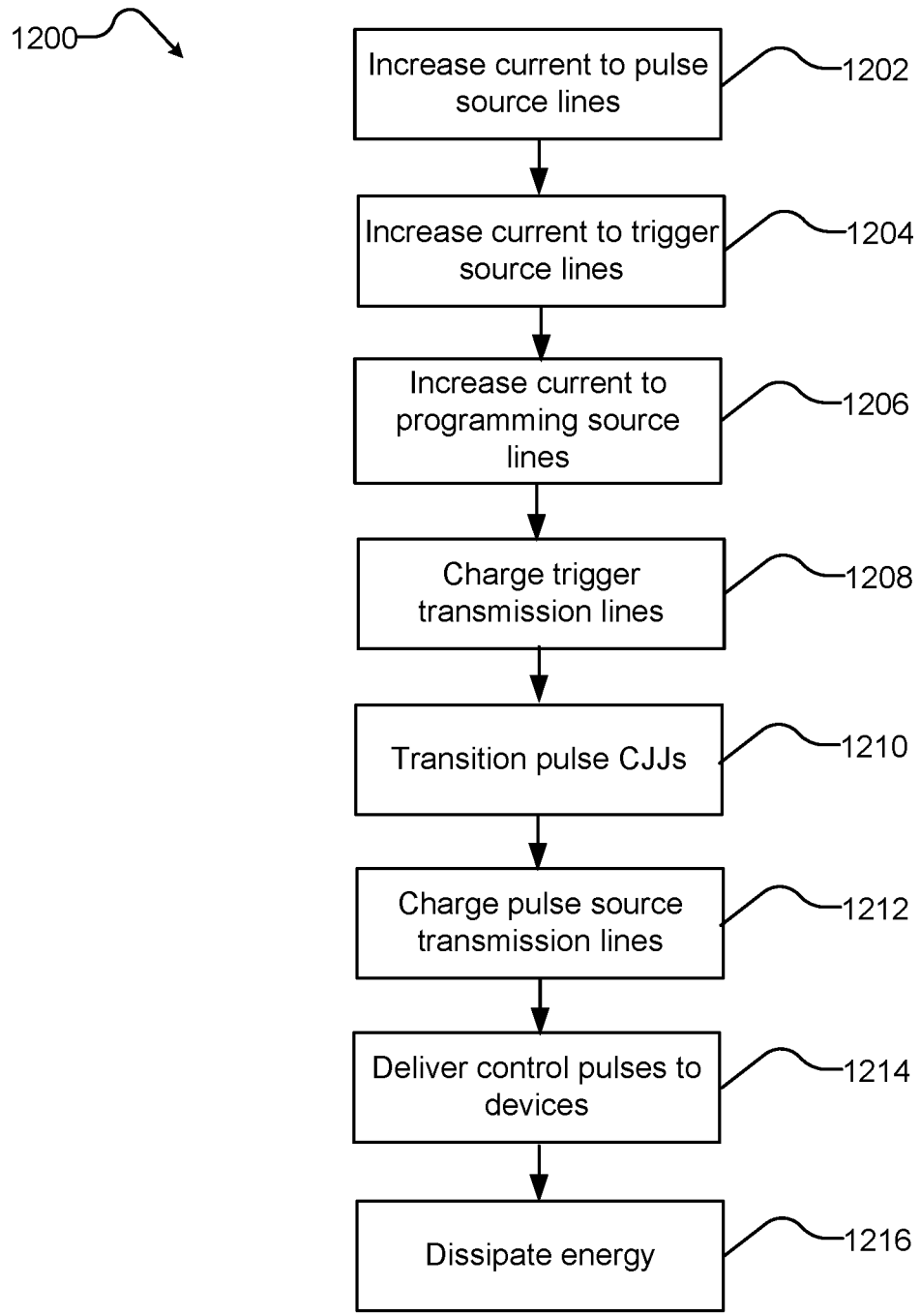
FIG. 12 is a flow chart of a method of generating multiple synchronized pulses from a plurality of pulse sources.

Various processor- or computer-readable and/or executable instructions, data structures, or other data may be stored in system memory 122. For example, system memory 122 may store instructions for communicating with remote clients and scheduling use of resources including resources on the digital computer 102 and analog computer 104. Also, for example, system memory 122 may store at least one of processor executable instructions or data that, when executed by at least one processor, causes the at least one processor to execute various algorithms. In some implementations system memory 122 may store processor- or computer-readable calculation instructions and/or data to perform pre-processing, co-processing, and post-processing to analog computer 104. System memory 122 may store a set of analog computer interface instructions to interact with analog computer 104. For example, the system memory 122 may store processor- or computer-readable instructions, data structures, or other data which, when executed by a processor or computer causes the processor(s) or computer(s) to execute one, more or all of the acts of methods 700, 1100, and 1200 (FIGS. 7, 11, and 12).

Analog computer 104 may include at least one analog processor such as quantum processor 126. Analog computer 104 may be provided in an isolated environment, for example, in an isolated environment that shields the internal elements of the quantum computer from heat, magnetic field, and other external noise. The isolated environment may include a refrigerator, for instance a dilution refrigerator, operable to cryogenically cool the analog processor, for example to temperature below approximately 1 K.

Analog computer 104 may include programmable elements such as qubits, couplers, and other devices (also referred to herein as controllable devices). Qubits may be read out via readout system 128. Readout results may be sent to other computer- or processor-readable instructions of digital computer 102. Qubits may be controlled via a qubit control system 130. Qubit control system 130 may include on-chip Digital to Analog Converters (DACs) and analog lines that are operable to apply a bias to a target device. Couplers that couple qubits may be controlled via a coupler control system 132. Coupler control system 132 may include tuning elements such as on-chip DACs and analog lines. Programmable elements may be included in quantum processor 126 in the form of an integrated circuit. In some examples, analog computer 104 can be a quantum annealing processor or a circuit model or gate model quantum processor.

Kinetic Inductance

Current flowing through a metal material in principle stores energy both in the magnetic field of that metal and in the kinetic energy of the charge carriers (e.g., the electrons or Cooper pairs). In non-superconducting metals, the charge carriers collide frequently with the lattice and lose their kinetic energy as Joule heating. This is also referred to as scattering, and quickly releases energy. However, in superconducting materials, scattering is substantially reduced, as the charge carriers are Cooper pairs which are protected against dissipation through scattering. This allows for superconducting materials to store energy in the form of kinetic inductance. This phenomenon allows kinetic inductance to efficiently store energy within the superconducting metal. Kinetic inductance is at least in part determined by the inertial mass of the charge carriers of a given material and increases as carrier density decreases. As the carrier density decreases, a smaller number of carriers must have a proportionally greater velocity in order to produce the same current. Materials that have high kinetic inductance for a given area (as defined below) are referred to as "kinetic inductance materials", or "high kinetic inductance materials".

Kinetic inductance materials are those that have a high normal-state resistivity and/or a small superconducting energy gap, resulting in a larger kinetic inductance per unit of area. In general, total inductance L of a superconducting material is given by $L=L_K+L_G$, where $L_G$ is the geometric inductance and $L_K$ is the kinetic inductance. The kinetic inductance of a superconducting film in near-zero temperatures is proportional to the effective penetration depth $\lambda_{eff}$. In particular, for a film with a given thickness t, the kinetic inductance of the film is proportional to the ratio of the length of the film L to the width of the film W, where length is in the direction of the current and width is orthogonal to length (note that both width and length are orthogonal to the dimension in which thickness is measured). That is, $$L_K \sim \lambda_{eff} \frac{L}{W}$$

for a superconducting film with a given thickness. The kinetic inductance fraction of a material is characterized as $$\alpha = \frac{L_k}{L_g + L_k}.$$

A material considered to have high kinetic inductance would typically have $\alpha$ in the range of $0.1 < \alpha \leq 1$. Materials with less than 10% of the energy stored as kinetic inductance would be considered traditional magnetic storage inductors with a small correction.

Entangling Gates

In the quantum circuit model of computation, quantum gates are used as the elements of computations, and interact with qubits to perform an operation or series of operations on one or more qubits. One of the fundamental interactions of a circuit model quantum computer is the ability to entangle the states of two or more qubits. As an example, the controlled not (CNOT) gate may be used to entangle two qubits. The CNOT gate may be used on a pair of qubits, where one qubit is a control, and the other qubit is a target. The CNOT gate performs an operation where if the first qubit is in the 1 state, the second qubit is flipped, and if the first qubit is in the 0 state, the second qubit remains unchanged. Given a control qubit that is in a superposition state, the use of this gate will place the target qubit into a superposition state as well, producing an entangled state between the two qubits.

In order to produce interaction between qubits within a quantum processor the qubits are communicatively coupled with some degree of connectivity. Qubits may be coupled to each other using couplers, which control interactions between qubits. Coupling qubits allows for entangling to occur, as discussed above. It may be beneficial to couple two or more qubits for a short but controlled amount of time, allowing qubits to become entangled, but not coupled for the duration of the entire computation. In some circumstances, it may be advantageous to provide a coupling that can be turned ON and OFF over a short time scale. For example, this may be beneficial in producing a 2-qubit entangling gate as may be used in circuit model quantum computing.

In implementations where the number of qubits is small, it may be possible to control couplings between qubits directly with control lines. However, devoting a control line to each coupling may be impractical for larger architectures. In particular, where qubit numbers are large, it may be advantageous to provide a coupling control that is scalable.

Control Structures and Couplers

Figure 6:
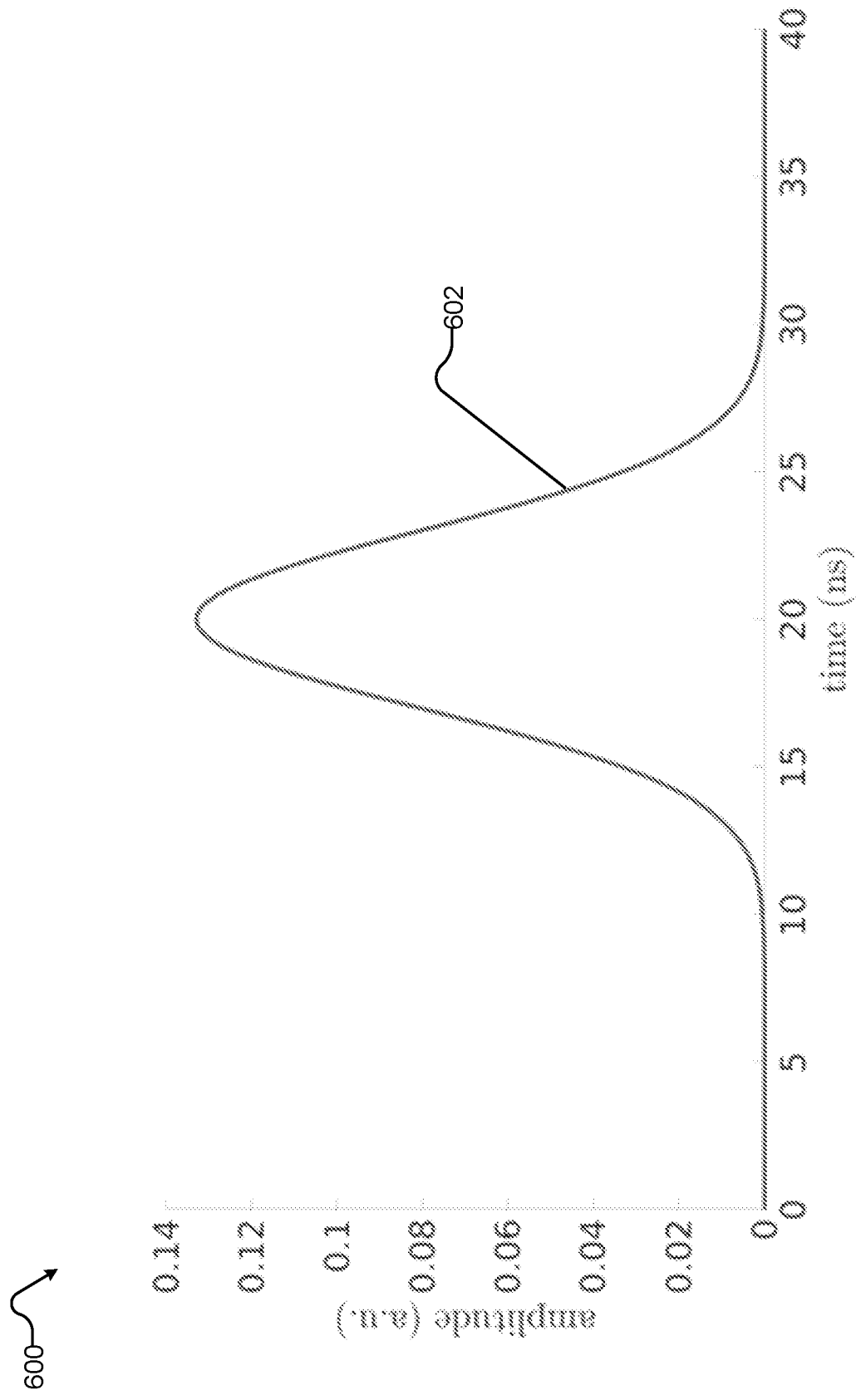
FIG. 6 is a graph of an example pulse for a coupling gate.

Described herein is a coupler that provides a fast coupling gate. In some implementations, a coupling gate may be provided by a Gaussian pulse, for example, a Gaussian pulse having a width of 3 ns, as shown in FIG. 6. Inductive or capacitive coupling may be provided between qubits, as discussed in further detail below.

Figure 2:
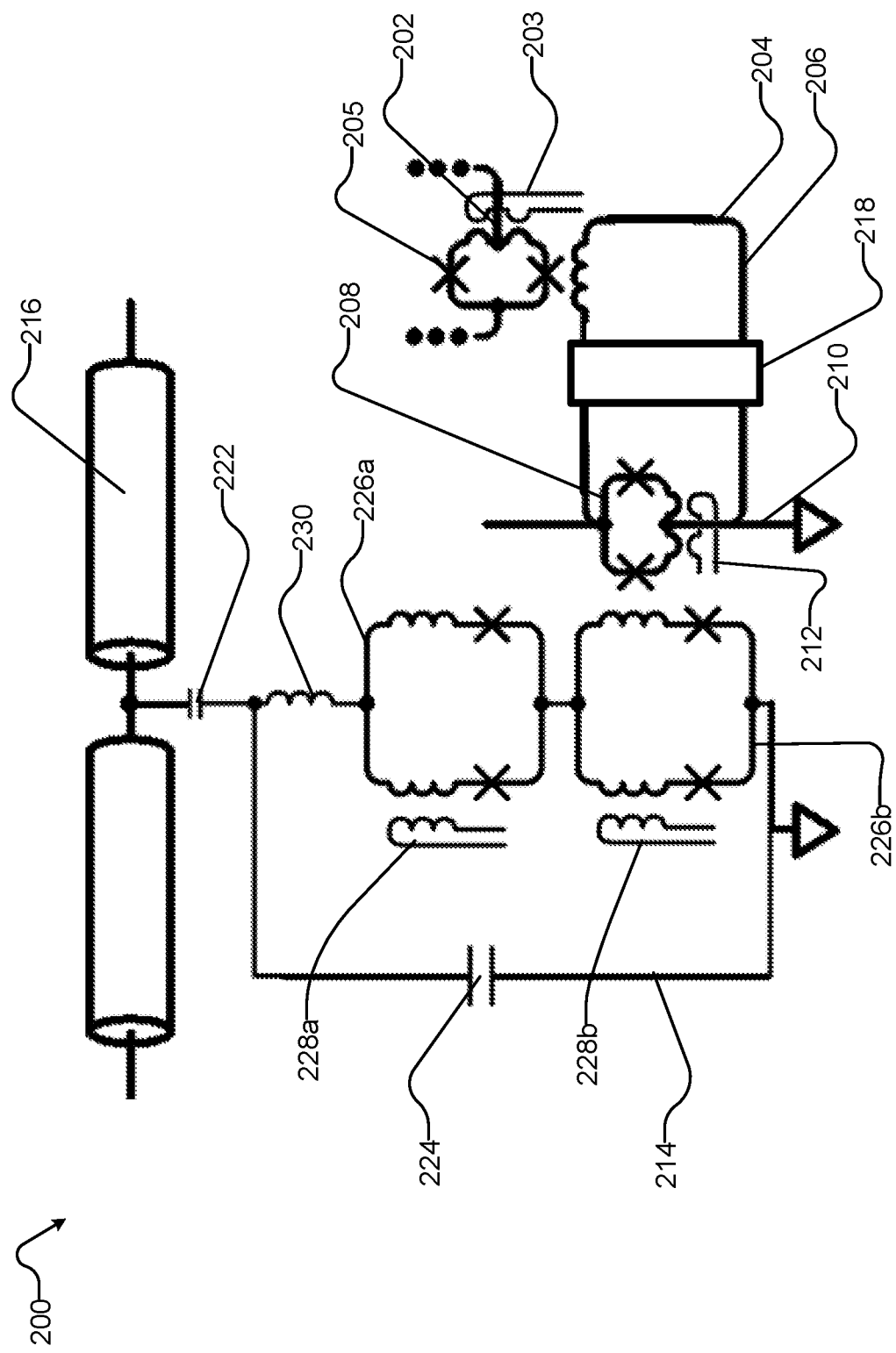
FIG. 2 is a schematic diagram of an example implementation of a superconducting integrated circuit.

Referring to FIG. 2, an example implementation of a superconducting integrated circuit 200 is shown. Superconducting integrated circuit 200 has coupler 202 in communication with first and second qubits (not shown, see FIGS. 3 and 4), coupler 202 coupling the first qubit with the second qubit. As discussed further with respect to FIGS. 3 and 4 below, coupler 202 may use either inductive or capacitive coupling between qubits. Coupler 202 has a control line 203 coupled to a compound Josephson junction 205.

In the example implementation of FIG. 2, a pulse source 204 is in communication with coupler 202, pulse source 204 having a superconducting loop 206 and a compound Josephson junction 208 interrupting superconducting loop 206. It will be understood that in other implementations, a single Josephson junction or a compound-compound Josephson junction may be used. A compound-compound Josephson junction (CCJJ) refers to a compound Josephson junction where at least one of the parallel Josephson junctions is itself a compound Josephson junction. Control lines 210 and 212 are in communication with compound Josephson junction (CJJ) 208. In some implementations, a DAC-biased coupler may be provided between the pulse source and the coupler and providing the communication between the pulse source and the coupler. Pulse source 204 may have a filter 218. In some implementations, filter 218 may be formed from a series of inductors and resistors. The arrangement of the components of filter 218 may be varied based on the particular implementation and the desired pulse shape. In some implementations, an additional pulse source may be in communication with control line 212, such that the control signal applied to control line 212 may also be provided by a pulse source. Further details of implementations of pulse sources are discussed below with respect to FIGS. 8 and 9, and an implementation with pulse sources controlled by synchronized lines is discussed below with respect to FIG. 10.

In the example implementation of FIG. 2, a resonator 214 is in communication with pulse source 204 and in communication with a transmission line 216. Resonator 214 may be coupled to transmission line 216 by a coupling capacitor. Resonator 214 may also include a body capacitor 224 in parallel with one or more superconducting quantum interference devices (SQUIDs) 226a, 226b. In the implementation of FIG. 2, one of the one or more SQUIDs 226b is in communication with pulse source 204. Further detail of the communication between the SQUID and the pulse source are described below with respect to FIGS. 3 and 4. SQUIDs 226a, 226b are in communication with control lines 228a, 228b, respectively. Resonator 214 also has body inductance 230 in parallel with body capacitor 224. A resonator, as described herein, refers to a device that may be addressed by a particular tone, allowing for multiple devices to be addressed by a single transmission line. When a tone is played for a particular resonator, the resonator will be biased. In implementations where a QFP is provided in communication with the resonator, this will result in a flux quantum being loaded onto the QFP. The resonator acts as a switch to determine which couplers will be turned ON. This method of addressing multiple devices using particular tones is referred to as frequency domain multiplexing. International Publication Number WO 2019/222514 describes resonator addressable DACs using a similar frequency domain multiplexing. The resonator may include one or more SQUIDS, such as the two SQUIDs of FIG. 2, or the one SQUID of FIG. 5. The SQUIDs may be used to tune the frequency at which the resonator is addressed by the transmission line. The SQUIDs may also be used to adjust the sensitivity of the resonator selection, that is, how large the resulting signal received by the resonator is in response to a given biasing tone that selects the resonator.

Figure 3:
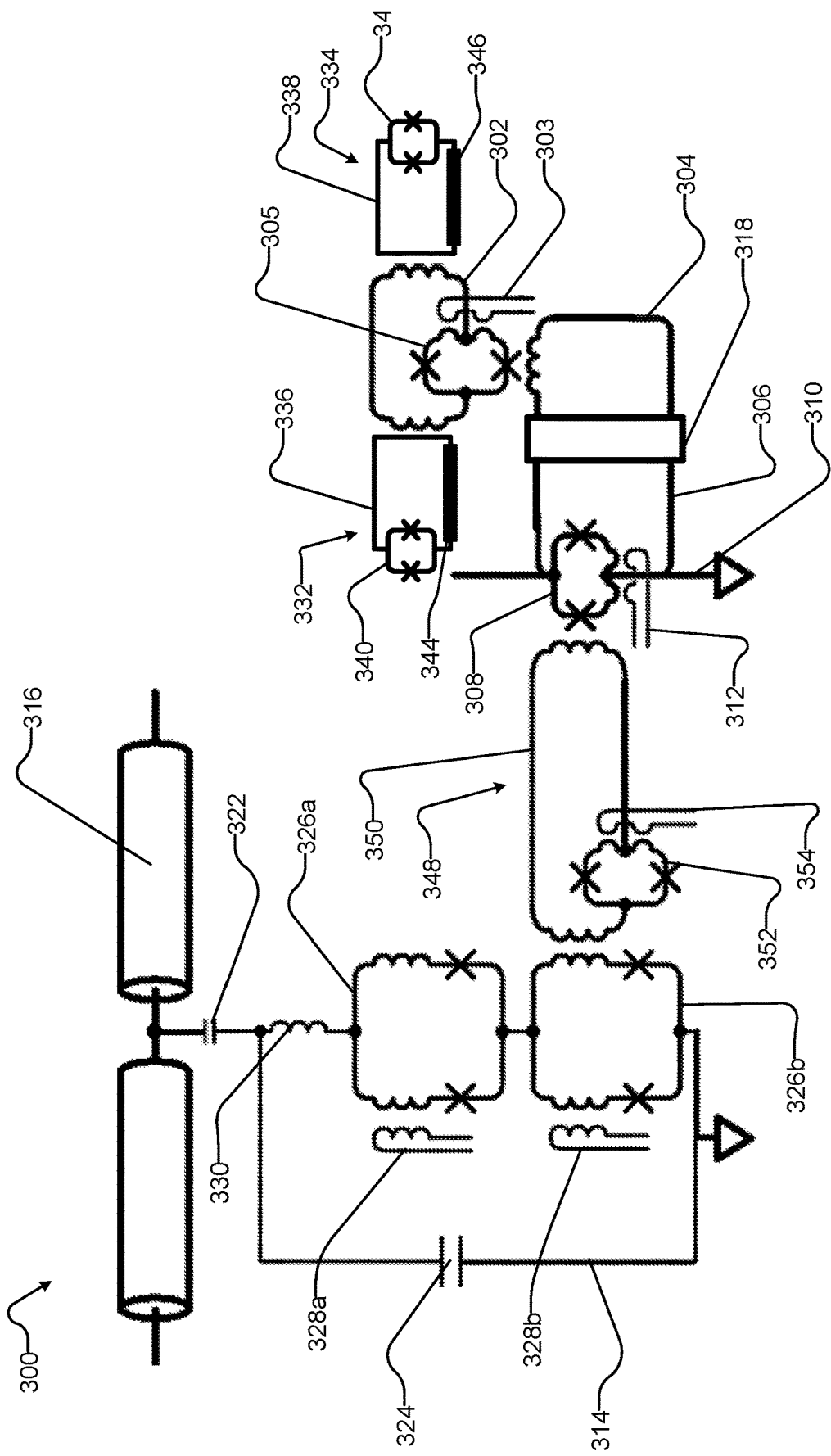
FIG. 3 is a schematic diagram of an alternative example implementation of a superconducting integrated circuit having inductive coupling to qubits.

Referring to FIG. 3, an example implementation of an alternative superconducting integrated circuit 300 is shown. Superconducting integrated circuit 300 operates in a similar manner to superconducting integrated circuit 200, with alternative structures, including a QFP coupling the resonator and pulse source. Superconducting integrated circuit 300 has coupler 302 in communication with first qubit 332 and second qubit 334. Coupler 302 is an inductive coupler, and uses inductive coupling between first qubit 332 and second qubit 334. As discussed in greater detail below with respect to method 700, when activated, coupler 302 provides communicative coupling between qubits 332 and 334 for the duration of the activation. Coupler 302 has a control line 303 in communication with compound Josephson junction 305. In the example implementation of FIG. 3, first and second qubits 332, 334 have a loop of superconducting material 336, 338 respectively, which is interrupted by at least one Josephson junction, 340, 342 respectively. Loop of superconducting material 336, 338 includes a body inductance 344, 346 respectively, that may be formed of a series of Josephson junctions or a section of high kinetic inductance material, as defined above. Qubits having high body inductance are described in further detail in U.S. Provisional Patent Application No. 63/223,686 and its counterpart International Patent Application No. PCT/US2022/037457. It will be understood that other types of superconducting qubits may also be coupled using a coupler as described herein. In the example implementation of FIG. 3, body inductance 344, 346 is a section of high kinetic inductance material. Pulse source 304 is in communication with coupler 302, pulse source 304 having a superconducting loop 306 and a compound Josephson junction 308 interrupting superconducting loop 306. Further details of pulse sources are discussed below with respect to FIGS. 8 through 12. Control lines 310 and 312 are in communication with compound Josephson junction 308. Pulse source 304 may have a filter 318. In some implementations, a DAC-biased coupler may be provided between the pulse source and the coupler and providing the communication between the pulse source and the coupler.

One or more quantum flux parametrons (QFPs) 348 may be provided in communication between resonator 314 and pulse source 304. In the implementation of FIG. 3, one QFP 348 is shown. However, it will be understood that a short shift register of QFPs may alternatively be provided (e.g., 2 or 3 QFPs in series). In some implementations, a short shift register may beneficially amplify the current from the resonator. In some implementations, the resonator may not provide sufficient current to trigger the QFP or pulse source, and a shift register may be selected to provide current amplification to achieve the threshold current. Some implementations of QFP shift registers are described in U.S. Pat. No. 8,169,231, US Patent Application Publication No. 2021/0013391, U.S. Provisional Patent No. 63/136,987 and its counterpart International Patent Application Publication No. WO 2022/155140, and International Patent Application Publication Number WO 2020/168097. QFP 348 provides communication between resonator 314 and pulse source 304. QFP 348 has a loop of superconducting material 350, a compound Josephson junction 352, and a control line 354. In some implementations, the one or more QFPs 348 may beneficially provide microwave isolation between the resonator and the pulse source. QFP 348 may also beneficially provide latching of a state, allowing the fast coupling gate to be generated without the microwave lines being active. In particular, the latched QFP may function as a static bias on CJJ 308 of pulse source 304 so that the timing of the coupler pulse may be determined by signals set to the control lines of the pulse source. In other implementations, such as the example implementation of FIG. 2, no QFPs may be included, and the resonator may be coupled directly to the pulse source.

Resonator 314 is also in communication with transmission line 316. Resonator 314 may include a coupling capacitor 322 in communication with transmission line 316 and a body capacitor 324 in parallel with one or more superconducting quantum interference devices (SQUIDs) 326a, 326b. In the implementation of FIG. 3, one of the one or more SQUIDs 326b is in communication by inductive coupling with QFP 348. SQUIDs 326a, 326b are in communication with control lines 328a, 328b, respectively. Resonator 314 also has body inductance 330 in parallel with body capacitor 324. SQUID 326a may be used to tune frequency offsets that may overlap with other resonators due to fabrication variations, allowing for each resonator 314 to be selectable by a particular frequency. SQUID 326b may be used to adjust the sensitivity of the resonator, that is, determining how large a resulting signal is provided as a result of a biasing tone in transmission line 316.

Figure 4:
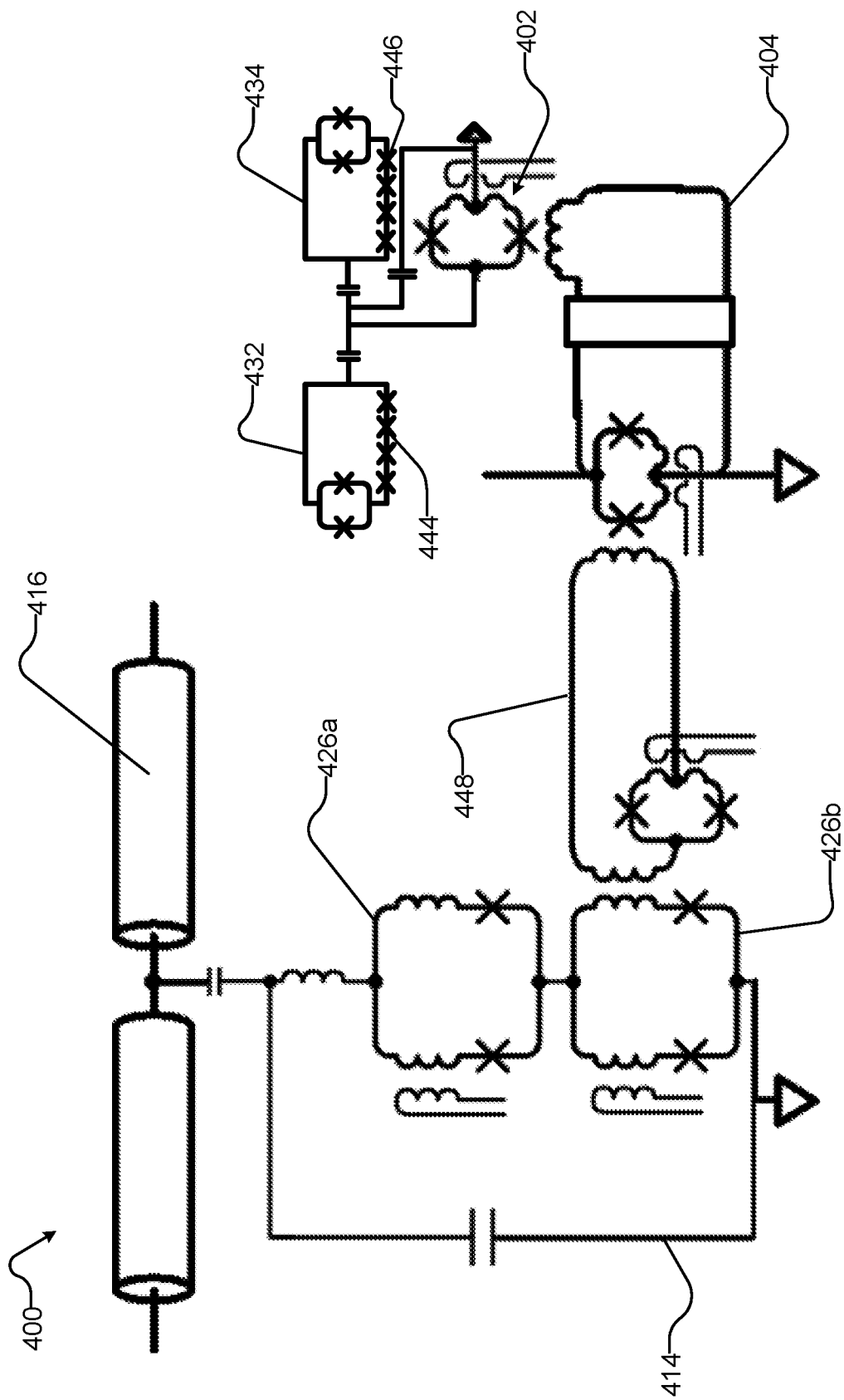
FIG. 4 is a schematic diagram of an alternative example implementation of a superconducting integrated circuit having capacitive coupling to qubits.

Referring to FIG. 4, an example implementation of an alternative superconducting integrated circuit 400 is shown. Superconducting integrated circuit 400 operates similarly to superconducting integrated circuits 200 and 300, and provides alternative implementations of some components, including capacitive coupling to qubits and alternative body inductances for qubits. Superconducting integrated circuit 400 has coupler 402 in communication with first qubit 432 and second qubit 434. Coupler 402 is a capacitive coupler, and provides capacitive coupling between first qubit 432 and second qubit 434. It will be understood that coupler 402 is one implementation of a capacitive coupler, and other capacitive couplers may be used in other implementations. As discussed in greater detail below, when activated, coupler 402 provides communicative coupling for the duration of the activation in order to provide a coupling gate. In the example implementation of FIG. 4, the body inductances 444, 446 of qubits 432 and 434 are a series of Josephson junctions. Similarly to FIG. 3, pulse source 404 is in communication with coupler 402. QFP 448 is in communication between resonator 414 and pulse source 404. QFP 448 provides communication between resonator 414 and pulse source 404. Resonator 414 is also in communication with transmission line 416. Resonator 414 has two SQUIDs 426a, 426b.

Figure 5:
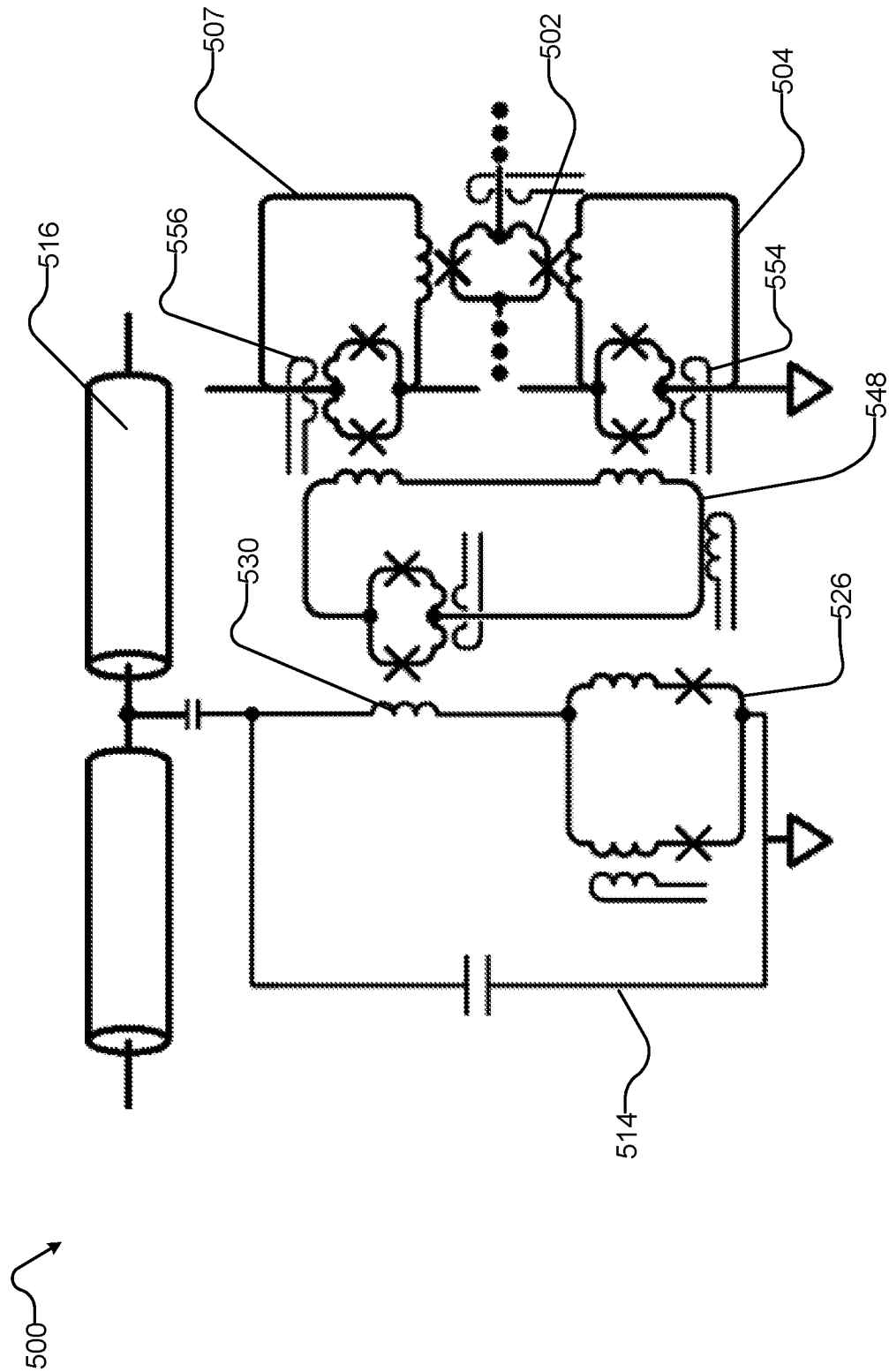
FIG. 5 is a schematic diagram of an alternative example implementation of a superconducting integrated circuit having two pulse sources.

Referring to FIG. 5, an example implementation of an alternative superconducting integrated circuit 500 is shown. Superconducting integrated circuit 500 operates similarly to superconducting integrated circuits 200, 300, and 400, and provides alternative implementations of some components, including an alternative QFP arrangement and dual pulse sources. Superconducting integrated circuit 500 has coupler 502 in communication with first and second qubits (not shown, see FIG. 3 and FIG. 4). Coupler 502 may be an inductive (FIG. 3) or capacitive (FIG. 4) coupler as discussed above. As discussed in greater detail below, when activated, coupler 502 provides communicative coupling for the duration of the activation in order to provide a coupling gate. In the example implementation of FIG. 5, two pulse sources 504 and 507 are in communication with coupler 502. QFP 548 is in communication between resonator 514 and both pulse sources 504 and 507. Resonator 514 is also in communication with transmission line 516. Resonator 514 has SQUID 526 and a body inductance 530, and QFP 548 is communicatively coupled to body inductance 530. In some implementations, the coupling duration of the coupling gate through coupler 502 may be controlled by adjusting the delay between the signals through control lines 554 and 556. For example, in one implementation, pulse sources 504 and 507 may be biased by QFP 548, such that the flux in pulse source 504 is opposite in direction and approximately equal in magnitude to the flux in pulse source 507. Control line 556 may be activated, causing flux from pulse source 507 to be introduced to the CJJ of coupler 502, activating coupler 502 and providing communicative coupling between two qubits. After a desired delay, control line 554 may be activated, causing flux to be introduced from pulse source 504. Due to the approximately equal but opposite flux, introducing flux by pulse source 504 deactivates coupler 502.

FIG. 6 shows a graph 600 of an example Gaussian pulse 602 at $t_0=20$ with a 3 ns standard deviation, as can be produced by some example implementations of the coupling circuits described with respect to FIGS. 2 through 5.

FIG. 7 is a flow chart illustrating an example method 700 of generating such a fast coupling gate to couple two qubits in accordance with the present systems and methods. Method 700 may, for example, be used with circuits 200 through 500 described with respect to FIGS. 2 through 5. Reference is made below with respect to circuit 200 of FIG. 2 below, however, it will be understood that these acts may similarly be applied to circuits 300, 400, and 500.

Method 700 includes acts 702-712, however, a person skilled in the art will understand that the number of acts is an example, and in some implementations, certain acts may be omitted, further acts may be added, and/or the order of the acts may be changed. Method 700 may be executed on a hybrid computing system comprising a digital processor in communication with the quantum processor, for example hybrid computing system 100 of FIG. 1.

Method 700 starts, for example, in response to a call from another routine, or in response to the start of a coupling procedure.

At 702, a power line (e.g., power line 210) connected to a pulse source (e.g., pulse source 204) comprising a compound Josephson junction (e.g., CJJ 208) interrupting a superconducting loop (e.g., loop 206) is energized, such as by a control line from outside the processor or through on chip control such as using a DAC. It will be understood that all signals applied to control lines described herein may be applied using a variety of off- or on-chip controls as will be understood by a person of skill in the art.

In some implementations, such as the example implementation of FIG. 5, the power line may be connected to a first and second pulse source in series, with each of the pulse sources being in communication with the coupler. In these implementations, energizing the power line will raise the power line current for both the first pulse source and the second pulse source.

At 704, a first biasing signal is applied to a coupler control line (e.g., control line 203) in communication with a coupler (e.g., coupler 202), the coupler in communication between the two qubits as discussed above.

At 706, a second biasing signal is applied to a resonator control line in communication with a resonator (e.g., control lines 228a, 228b, resonator 214). In some implementations, the second biasing signal may be applied to a resonator control line in communication with one or more superconducting quantum interference devices (SQUIDs). As discussed in further detail above, the one or more SQUIDs may be used to tune the tone at which the resonator is activated, and the response of that resonator to activation.

At 708, a tone is induced on a transmission line (e.g., transmission line 216) that selectively communicates with the resonator to bias the resonator, the resonator coupling a signal to the pulse source in combination with the energized power line.

Optionally, at 710, a signal may be applied to a control line in communication with a quantum flux parametron (QFP) (e.g., QFP 348, control line 354). As discussed above, the QFP may be in communication between the resonator and the pulse source so that the resonator couples a signal to the QFP and the QFP couples a signal to the pulse source in combination with the energized power line At 712, a third biasing signal is applied to a pulse source control line (e.g., control line 212) in communication with the pulse source, the pulse source applying a pulse to the coupler in response to the third biasing signal to couple the two qubits for the duration of the coupling gate. As discussed above, the pulse source may have a filter, and the pulse amplitude and duration may be moderated by the filter in the pulse source.

In some implementations, such as the example implementation of FIG. 5, the third biasing signal may be applied to a first pulse source control line in communication with the first pulse source, and a fourth biasing signal may be applied to a second pulse source control line in communication with the second pulse source. In some implementations, applying a third biasing signal and a fourth biasing signal may occur with a delay between the pulses that applies a pulse to the coupler, with the coupling duration between the qubits determined by the delay between the pulses. As discussed above, this may be performed by inducing opposite flux in the first and second pulse sources. Both pulse sources may have filters that allow for the coupling gate amplitude and duration to be moderated.

After 712, the method terminates until it is, for example, invoked again. In some implementations, method 700 may begin again with respect to another coupler and another pair of qubits that are to be coupled. In some implementations, method 700 may be performed in parallel on multiple pairs of qubits within a quantum processor. Method 700 may also be performed successively on the same pair of qubits within a single computation.

Method 700 may beneficially allow for a coupling gate to be delivered between two qubits over a short time period and having a controlled rise and fall. It may be beneficial in some implementations to provide a coupling gate having a fast rise and a fast fall, similar to the profile shown in FIG. 6. The inclusion of filters, which may be provided by a network of inductors or resonators, slow the rise and fall of the pulse and allow the duration and amplitude of the coupling gate to be controlled. Similarly, the inclusion of two pulse sources may allow for the adjustment of coupling time by varying the delay between the biasing signals applied to each pulse source. The use of frequency multiplexing to address the resonator may beneficially allow for particular resonators to be addressed without a large number of control lines from outside the quantum processor.

In some implementations, it may be beneficial to examine the dynamics of quantum devices at a time between the start and end of a quantum evolution. Sampling of qubit states at a point between a start and an end of an anneal can be useful for applications such as quantum Boltzmann sampling and quantum processor calibration. This may, for example, be achieved by applying a signal that raises the energy barrier of a qubit using a fast-step waveform. International Publication Number WO 2019/217313 describes a method of projective readout using a projective source DAC (PSDAC) as a fast flux step source. Projective measurement may be useful in measuring a qubit while the qubit is undergoing quantum evolution. This may be particularly useful when the qubit is in the coherent regime where the energy barrier is low and quantum effects are strong. This may beneficially allow greater visibility into the part of a quantum system where quantum effects dominate.

Similarly to the projective measurement discussion above, qubit dynamics may be stopped during an anneal by other techniques that apply a signal to stop system dynamics. As discussed above, it may be beneficial to provide a pulse source within a quantum processor as part of providing a fast coupling gate. Pulse sources may also be used for other purposes within a quantum processor. For example, a pulse source may be used to quench a system of qubits by changing the potential of the system of qubits significantly faster than the quantum mechanical evolution of the system. This may advantageously stop the system dynamics abruptly, allowing for analysis of the system of qubits at a particular time during a quantum mechanical evolution. A pulse source may also be used to apply a fast signal for programming or readout, for example as part of an on-chip multiplexed control scheme where fast signals are beneficial. In some implementations, control signals provided by room temperature lines may not provide sufficiently fast signals or may generate too much noise for a particular implementation. Generating signals from off chip may result in cross-talks and significant power dissipation, and it may therefore be beneficial to provide a pulse source within the quantum processor. When used to stop the system dynamics of qubits, the pulse source may also be referred to as a quench source.

Quenching a system of qubits can allow their states early in the annealing process to be investigated. This may allow for probing of the evolution of the system throughout the annealing process. This may be used in processes such as modelling, debugging, and selecting annealing parameters. Measuring the system early in the annealing operation may also assist in solving quantum simulation problems. Quickly moving current into and out of current-carrying lines may also be beneficial in other applications, such as the fast coupling gate application described above, or when applying fast control signals to other devices.

Figure 8:
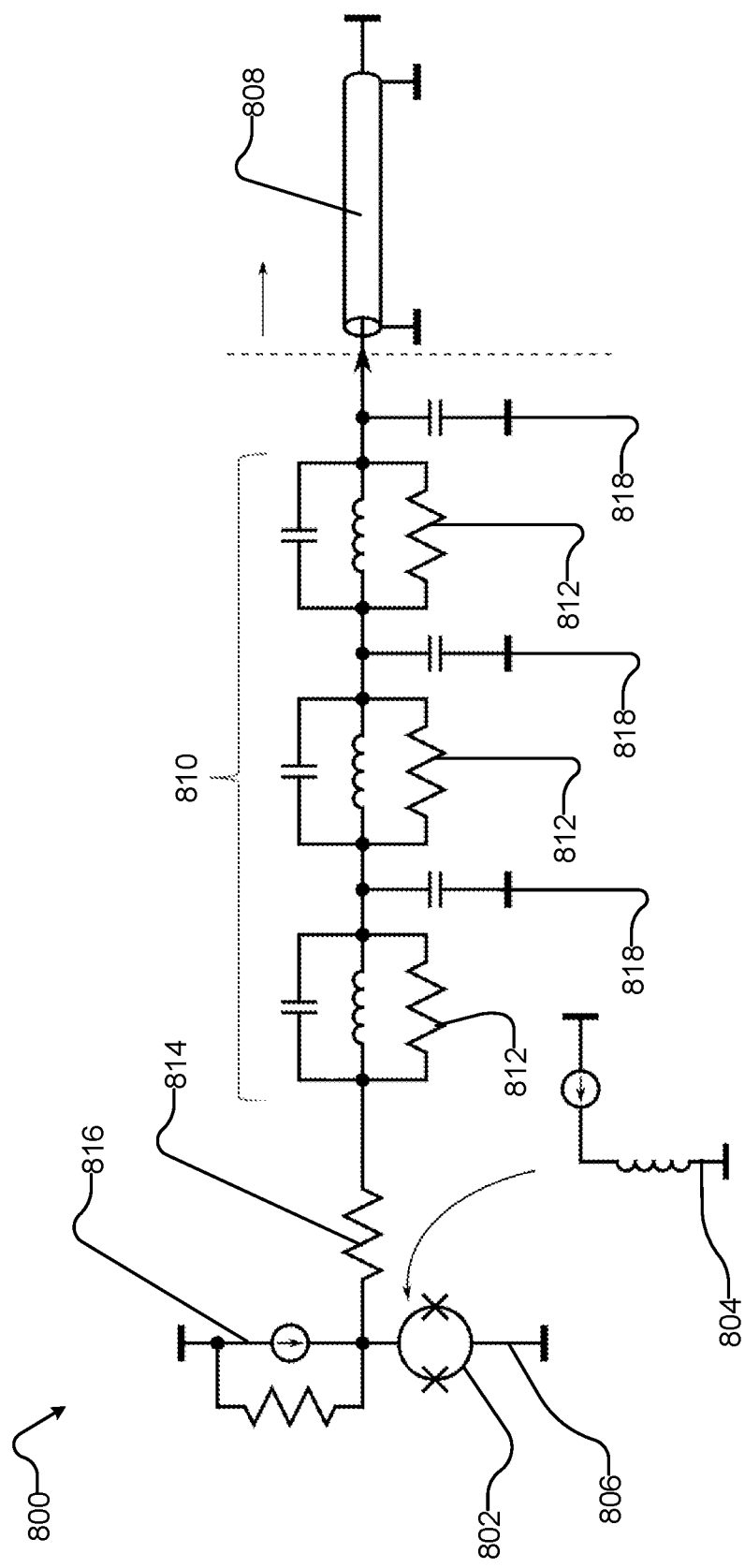
FIG. 8 is a schematic diagram of an example implementation of a pulse source.

Referring to FIG. 8, an example implementation of a pulse source 800 is shown. Pulse source 800 generates, in response to a relatively slower control signal, a fast current step into an inductive load that may be used to control one qubit or simultaneously control several qubits. Pulse source 800 is a superconducting integrated circuit including a first compound Josephson junction (CJJ) 802 and a first trigger control line 804 in communication with CJJ 802. In other implementations the circuit may include a single Josephson junction (JJ), or a compound compound Josephson junction (CCJJ). A power control line 816 is galvanically coupled to CJJ 802, while a first trigger control line 804 is inductively coupled to CJJ 802. A first superconducting current path 806 is interrupted by CJJ 802. In some implementations a superconducting integrated circuit providing a pulse source may also have multiple CJJs, multiple JJs, or multiple CCJJs in series interrupting the first superconducting current path. In some implementations, multiple JJs, CJJs, or CCJJs (collectively junction structures) in series may advantageously generate a larger voltage than a single junction structure. This may, in turn, generate a greater current or a faster pulse, which may be beneficial. In some implementations, a single junction structure may produce a voltage on the order of a microvolt, while a series of junction structures may produce a voltage on the order of a volt. Current path 806 includes a transmission line 808 that is in communication with a target device (not shown). The target device may include a qubit or system of qubits to be quenched, or a coupler intended to deliver a fast coupling gate between two qubits, such as the couplers 202, 302, 402, and 502 discussed above. In some implementations, transmission line 808 may be magnetically (inductively) coupled to a junction structure of a target qubit. It will be understood that the junction structure may be a CJJ or a CCJJ. A filter 810 is in series with transmission line 808 and may be a series of damped spirals 812 making up a low pass filter, as shown in the implementation of FIG. 8. In some implementations, a damped spiral may be formed from one or more spiral superconducting traces arranged in parallel with one or more resistors. An example of an on chip low pass filter formed by spiral superconducting traces is found in Watanabe et al., *Resonance-Free Low-Pass Filters for the AC Josephson Voltage Standard*, IEEE Transactions on Applied Superconductivity, Vol. 16, No. 1, March 2006. Similar spirals may be used to provide filter 810, with the components of damped spirals 812 representing the capacitance, inductance, and resistance provided by each spiral. In other implementations, a filter may include a superconducting trace formed from a high kinetic inductance material, one or more resistors and one or more inductors, as discussed above. In some implementations, filter 810 can shield transmission line 808 from high frequency signals in order to provide an approximately inductive load. A resistor 814 is also in series with transmission line 808, and acts to dissipate energy stored in transmission line 808 during reset. In the implementation of FIG. 8, capacitors to ground 818 are provided between filter stages provided by damped spirals 812 of filter 810. Capacitors to ground 818 may be provided to control the impedance of the load on the CJJ source. This may beneficially optimize power delivery, allowing delivery to be relatively fast with minimal reflections. In the implementation of FIG. 8, and throughout this specification, it will be understood that the represented capacitors, inductors, and resistors may take the form of discrete structures, or may represent properties inherent to other components of the circuit.

Figure 9:
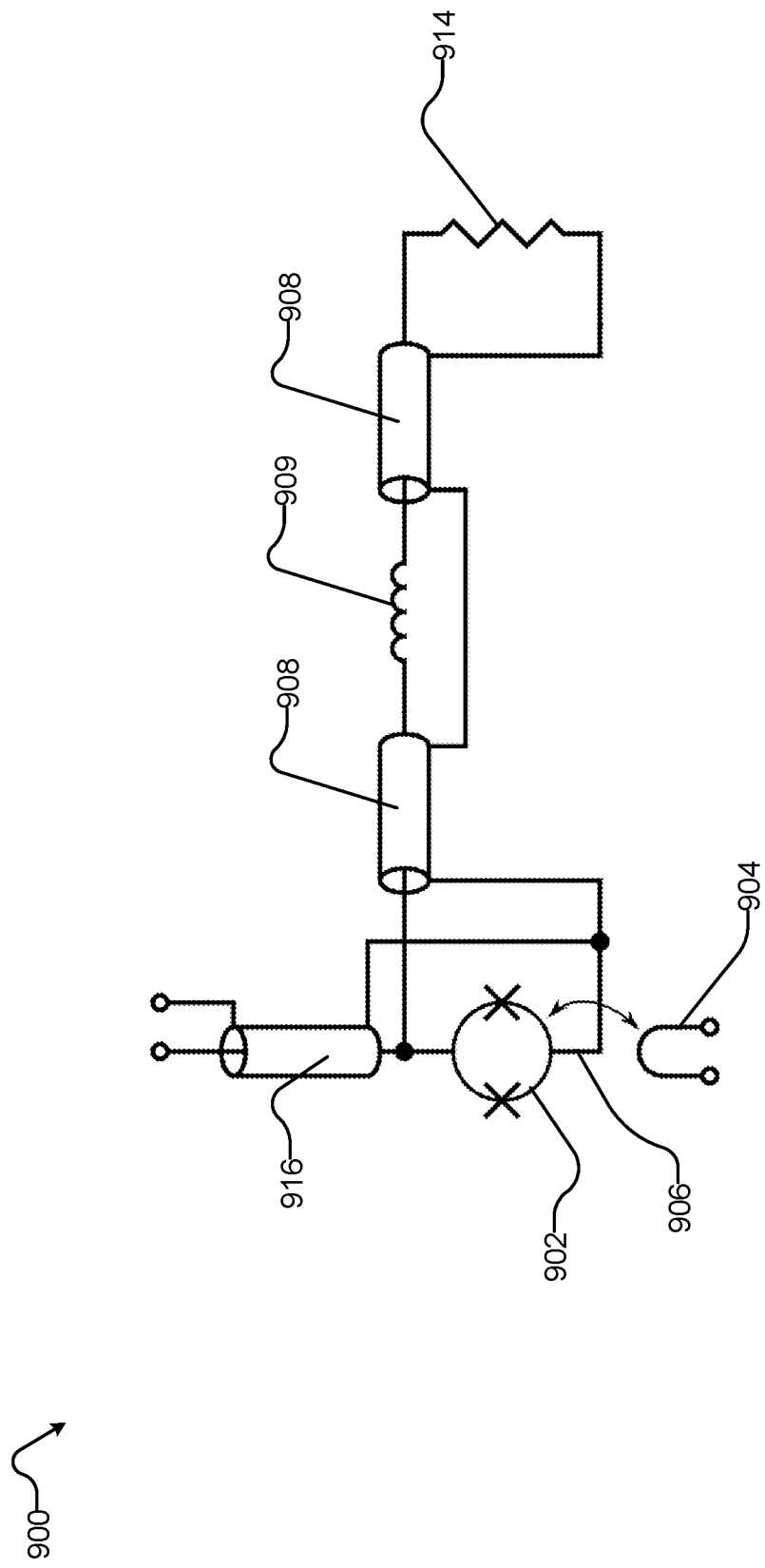
FIG. 9 is a schematic diagram of an alternative example implementation of a pulse source.

Referring to FIG. 9, an alternative example implementation of a pulse source 900 is shown. Pulse source 900 has a first CJJ 902 interrupting a superconducting current path 906. A power control line 916 is galvanically coupled to CJJ 902 through current path 906, and a trigger control line 904 is inductively coupled to CJJ 902. A transmission line 908 may inductively couple to a target device (not shown in FIG. 9) such as a qubit or coupler through inductive interface 909. A resistor 914 is provided in series with transmission line 908 to dissipate energy during reset. In some implementations, a filter may be provided in series with transmission line 908 to shield transmission line 908 from high frequency signals. In the implementation of FIG. 9, inductor 909 and resistor 914 act in combination as a filter. In some implementations, different combinations of inductors and resistors may form filters. For example, multiple inductors may be coupled in series with one resistor to provide a filter and a high inductance. Pulse source 900 may be coupled to one or more qubits to provide a fast anneal signal to quench a qubit.

Figure 10:
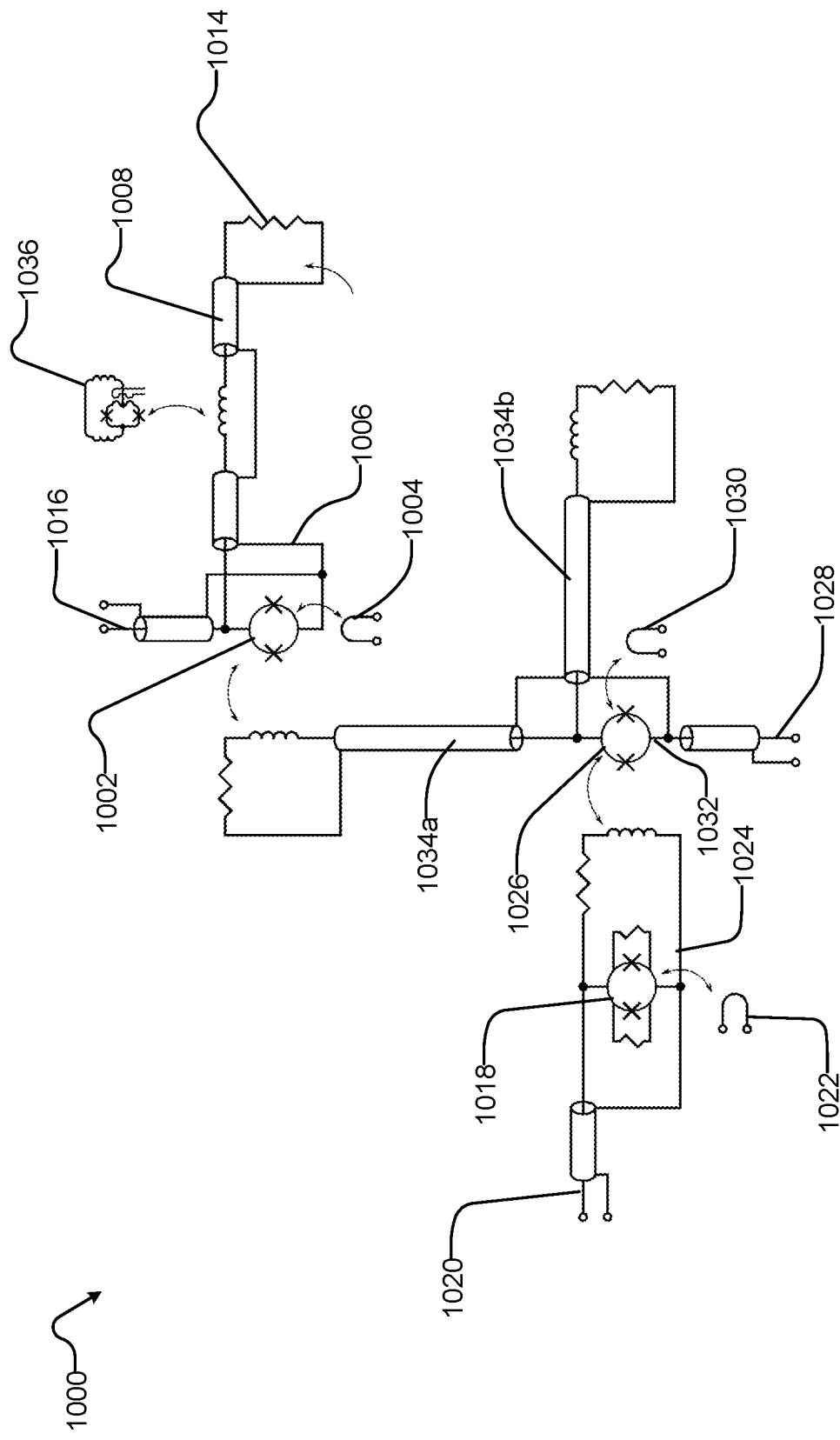
FIG. 10 is a schematic diagram of an example implementation of a synchronized control circuit for a plurality of pulse sources.

Referring to FIG. 10, a superconducting integrated circuit 1000 has a synchronized control circuit connected to one or more pulse sources. The pulse source has a first CJJ 1002, superconducting current path 1006, power control line 1016, and trigger control line 1004. The pulse source of FIG. 10 is similar to pulse source 900 of FIG. 9. Transmission line 1008 is in series with resistor 1014. Superconducting integrated circuit 1000 also has a second CJJ 1018 galvanically coupled with second power control line 1020 and inductively coupled with second trigger control line 1022 and a superconducting loop 1024 interrupted by CJJ 1018. CJJ 1018 and superconducting loop 1024 may form a control structure that may apply a fast single flux quantum (SFQ) pulse to a connected device. This control structure may also be referred to as a programming source, or a dc/SQF converter. This pulse may beneficially trigger the coupled target device relatively faster than can be done by a signal generated off-chip, providing precise control of the target device. A third CJJ 1026 is inductively coupled to superconducting loop 1024 and galvanically coupled with a third power control line 1028 and inductively coupled with a third trigger control line 1030. A second superconducting current path 1032 is interrupted by CJJ 1026, and has additional transmission lines 1034a and 1034b. Transmission line 1034a is coupled to first CJJ 1002. Transmission line 1034b may be coupled to a second pulse source (not shown in FIG. 10) similar to the one shown coupled to transmission line 1034a. In some implementations, multiple pulse sources may be coupled to a single transmission line. For example, transmission line 1034a may be coupled to a first plurality of pulse source CJJs 1002, and transmission line 1034b may be coupled to a second plurality of pulse source CJJs 1002. The pulse source may be coupled to a qubit 1036 or a plurality of qubits. By providing multiple pulse sources, multiple qubits may be coupled and a fast anneal signal may be provided to quench a plurality of qubits approximately or completely simultaneously.

Referring to FIG. 11, an example implementation of a method 1100 of generating a pulse from a pulse or quench source is shown. Method 1100 may be executed on a hybrid computing system comprising at least one digital or classical processor and a quantum processor, for example hybrid computing system 100 of FIG. 1, or may be executed on a quantum computing system comprising at least one quantum processor. The method 1100 may be employed as part of a method to provide a fast coupling gate as discussed above with respect to method 700 and circuits 200, 300, 400, and 500, or as part of a method to stop the evolution of a qubit or a series of qubits as discussed with respect to circuits 800, 900, and 1000.

Method 1100 comprises acts 1102 to 1108, however, a person skilled in the art will understand that the number of acts illustrate is an example, and, in some implementations, certain acts may be omitted, further acts may be added, and/or the order of the acts may be changed.

Method 1100 starts, for example, in response to a call or invocation from another routine.

At 1102, the current in a control line is increased to a threshold (e.g., predetermined threshold determined based on circuit parameters from design or calibration) such that a compound Josephson junction (CJJ) transitions to a voltage state. For example, in some implementations, this current may be around 100 uA. In some implementations the current may be increased relatively slowly. Relatively slow transmission lines may be beneficial as these transmission lines may dissipate less power on a chip, reducing the potential heating of a chip, which may be detrimental to the performance of the quantum processor. Method 1100 may beneficially allow for a relatively slow triggering signal to provide a relatively fast pulse for coupling or to stop evolution of a qubit or series of qubits. Increasing the current in a control line to a threshold (e.g., predetermined threshold) may include increasing the current in two control lines to achieve a combined current at a threshold (e.g., predetermined threshold). For example, in the example implementation of FIG. 8, the current in both first trigger control line 804 and control line 816 may be increased to achieve a combined current that transitions CJJ 802 to a voltage state.

Josephson junctions may be formed in numerous ways, including trilayer junctions formed by two superconducting electrodes separated by a thin insulating layer, or by a restriction in a superconducting path. Examples of Josephson junctions and compound Josephson junctions can be found in U.S. Pat. Nos. 8,951,808, and 8,536,566, as well as U.S. Provisional Patent Application No. 63/023,048 and its counterpart International Patent Application Publication No. WO2021/231224. Josephson junctions have a critical current, or a maximum current that can flow through a Josephson junction in a superconducting state. For currents above this critical current, the Josephson junction will switch from a superconducting state to a voltage state. As such, when the current delivered by a control line or lines reaches a threshold at which the critical current of the compound Josephson junction (CJJ) is overwhelmed, the junction will transition into the voltage state. In some implementations the CJJ may be damped to allow the transition to the voltage state to occur more easily. In some implementations, damping may beneficially increase the predictability of a junction's behavior, providing a more controllable voltage state that behaves less chaotically.

Optionally, a qubit or system of qubits may be brought into a desired pre-quench state. For example, an annealing evolution may be performed on a system of qubits until reaching a desired state. In other implementations, a fast coupler may undergo a series of pre-pulse steps as discussed above with respect to FIG. 700.

At 1104, a transmission line is charged from the CJJ by increasing the current through the transmission line to a threshold (e.g., predetermined threshold). For example, in some implementations, this current may be around 1 mA. In some implementations, it may be beneficial to increase this current slowly. The junction (CJJ) jumping into the voltage state results in the junction voltage charging the load transmission line and the low-pass filter spirals. This act may occur quickly (the pulse or fast quench). In some implementations, this may take around 1 ns. The junction voltage charging the load transmission and the low-pass filter spirals may be thought of as redistributing the control signal from the junction arm into the load arm.

At 1106, a control pulse is delivered to a device in communication with the transmission line. This may include delivering a control pulse to one or more qubits to stop the evolution of those qubits, or alternatively, may include delivering a control pulse to a coupler to produce a fast coupling gate as discussed above with respect to FIG. 7. When the load is in communication with a qubit or qubit system, the load current results in the potential of the qubit or qubit system being such that the qubit dynamics will stop. Alternatively, the pulse source may have delivered the pulse as part of a fast coupling gate.

At 1108, the energy stored in the load inductance is dissipated through a resistor to reset the circuit. At some point, the junction current approaches 0, which results in the junction "re-trapping" or returning to the superconducting state. The desired load current now flows through the load portion of the circuit.

After performance of the pulse or quench, and on a slower time scale, the circuit resets automatically. The resistor in series with the load dissipates the energy stored in the load inductance. In some implementations this dissipation may be on the order of 1 μs. During the reset, the control line current is reduced to allow the CJJ critical current to return to its nominal value.

In some implementations, such as where the quench source is used with a system of qubits, additional control lines may be used to maintain the qubits in a particular state and read out the qubits. For example, as the current through the control line of the quench source is decreased, a current through a slower CJJ control line may be manipulated to maintain the qubits in the quenched or "frozen" state. These qubits may then be read out by any method known in the art. For example, U.S. Pat. No. 8,854,074 describes systems and methods for reading out the states of superconducting flux qubits.

Method 1100 may then terminate until it is, for example, invoked again, or method 1100 may repeat. Once reset is completed, the remaining current from the control line is redistributed into the junction arm. The quench source is now reset and may be triggered again.

Referring to FIG. 12, an example implementation of a method 1200 of operating a synchronized control quench source to generating multiple synchronized pulses from a plurality of pulse sources is shown. Method 1200 may be executed on a hybrid computing system comprising at least one digital or classical processor and a quantum processor, for example hybrid computing system 100 of FIG. 1, or may be executed on a quantum computing system comprising at least one quantum processor.

Method 1200 comprises acts 1202 to 1216, however, a person skilled in the art will understand that the number of acts illustrate is an example, and, in some implementations, certain acts may be omitted, further acts may be added, and/or the order of the acts may be changed. Method 1200 may, for example, be used to operate superconducting integrated circuit 1000 discussed above as a synchronized control quench source.

Method 1200 starts, for example, in response to a call or invocation from another routine.

At 1202, the current in a plurality of pulse source control lines is increased to a first threshold (e.g., first predetermined threshold), the plurality of pulse source control lines in communication with respective pulse sources, each pulse source having a respective pulse compound Josephson junction (CJJ). In some implementations the pulse sources may have first and second control lines, such as control lines 1004 and 1016 of FIG. 10, where the first pulse source control line 1016 is galvanically coupled to pulse CJJ 1002 and the second pulse source control line 1004 is inductively coupled to pulse CJJ 1002. The current in the plurality of first and second pulse source control lines may be increased to achieve a combined current at the first threshold (e.g., first predetermined threshold). In some implementations this threshold may be around 100 uA. The first threshold (e.g., first predetermined threshold) may be selected to be below the threshold that pushes the pulse CJJ 1002 into the voltage state, and may prepare or prime the pulse source for triggering by a trigger source.

At 1204, the current through a trigger control line for a trigger source is increased to a second threshold (e.g., second predetermined threshold), the trigger source having a trigger CJJ. In some implementations, the trigger source may also have first and second control lines, such as control lines 1028 and 1030 of FIG. 10, where first trigger source control line 1028 is galvanically coupled to trigger source CJJ 1026 and second trigger source control line 1030 is inductively coupled to trigger source CJJ 1026. The current in the first and second trigger control lines may be increased to achieve a combined current at the second threshold (e.g., second predetermined threshold). In some implementations this threshold may be around 100 uA.

At 1206, the current through a programming source control line for a programming source (in some implementations, a dc/SFQ converter) is increased to a third threshold (e.g., third predetermined threshold), the programming source having a programming CJJ, the third threshold (e.g., third predetermined threshold) selected such that the programming CJJ transitions and provides a flux quantum to a line inductively coupled to the trigger CJJ such that the trigger CJJ transitions or jumps to the voltage state, as discussed above. In some implementations, the programming source may also have first and second programming source control lines, such as control lines 1020 and 1022 of FIG. 10, with first programming source control line 1020 galvanically coupled to programming CJJ 1018 and second programming source control line 1022 inductively coupled to programming CJJ 1018. The current in the first and second programming source control lines may be increased to achieve a combined current at the third threshold (e.g., third predetermined threshold). In some implementations this threshold may be around 100 uA. In other implementations, this threshold may be around 1 mA. In some implementations, the threshold is determined by the critical current of a CJJ, which may, for example, be determined by the materials used to form the junctions, as well as other fabrication parameters.

At 1208, a plurality of trigger transmission lines from the trigger CJJ are charged, each trigger transmission line galvanically coupled to the trigger CJJ and inductively coupled to a respective pulse CJJ. The voltage from the trigger CJJ (e.g., 1026 in FIG. 10) charges the transmission lines (e.g., 1034a, 1034b in FIG. 10) that are in communication with the pulse sources (e.g., inductively coupled as shown in FIG. 10). In some implementations, this voltage charge may beneficially occur on 5 Ohm transmission load lines, and may occur faster than the rise-time of each pulse source. Each pulse source may therefore be triggered at the same time by the rising trigger source load current.

At 1210, each pulse CJJ (e.g., 1002 in FIG. 10) is transitioned by the charged trigger transmission lines.

At 1212, a plurality of pulse source transmission lines (e.g., 1008 in FIG. 10) are charged from the pulse CJJs, the plurality of pulse source transmission lines galvanically coupled to a respective one of the pulse CJJs.

At 1214, a plurality of control pulses is delivered to a plurality of devices, each device of the plurality of devices in communication with a respective one of the plurality of pulse source transmission lines. The control pulses may be delivered substantially simultaneously. In some implementations, the control pulses may be delivered to a plurality of qubits (e.g., qubit 1036 of FIG. 10), the dynamics of the one or more qubits being stopped by the control pulse. The dynamics of the qubits may be an evolution, such as an annealing evolution. In some implementations, the plurality of qubits may be programmed into a desired pre-quench state prior to the plurality of control pulses being delivered. For example, in some implementations the plurality of qubits may be annealed to a mid-anneal state of interest. The state of the plurality of qubits may be read out after the qubit dynamics are stopped in response to the control pulses. This may beneficially allow for the qubit dynamics across an entire processor to be stopped simultaneously and read out to provide information about the processor or qubit dynamics as a whole. In other implementations, the control pulses may be delivered to a plurality of couplers to produce a plurality of fast coupling gates.

At 1216, the energy stored in the plurality of pulse source transmission lines is dissipated. In some implementations, the energy is dissipated through a plurality of resistors, each resistor of the plurality of resistors connected to a respective one of the transmission lines, such as resistor 1014 of FIG. 10. The programming source may also be reset by dissipating energy through a resistor. For example, in some implementations these may be 8 mOhm resistors. These may be dimensioned so that the trigger mechanism fires exactly once. The current in the control line used to trigger the programming source may beneficially be reduced fast enough to ensure that the process does not repeat or re-trigger.

Method 1200 may then terminate until it is, for example, invoked again, or method 1200 may repeat.

Figure 13:
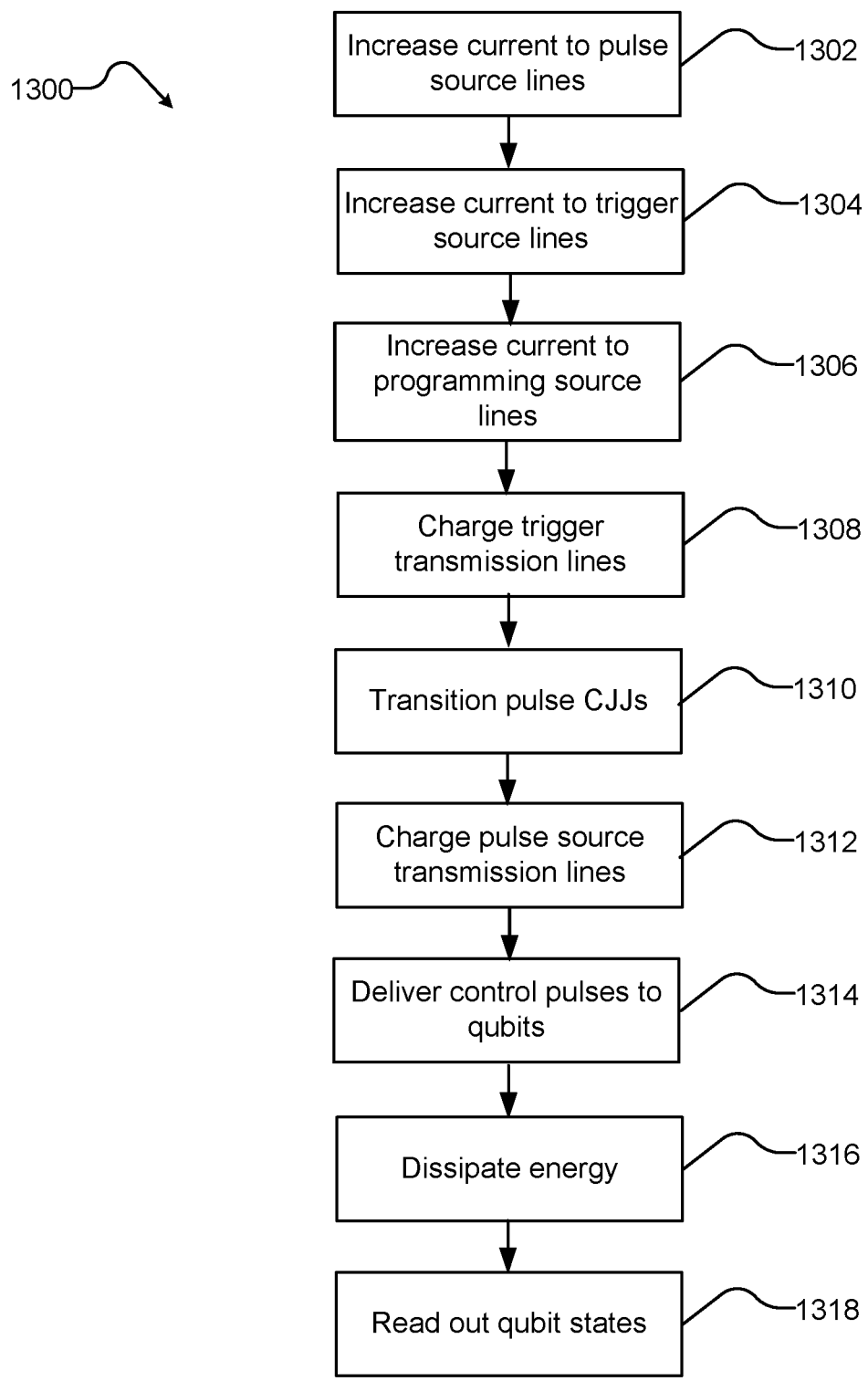
FIG. 13 is a flow chart of a method of reading out the states of a plurality of qubits.

Referring to FIG. 13, an example implementation of a method 1300 of operating a synchronized control quench source to generating multiple synchronized pulses from a plurality of pulse sources is shown. Method 1300 may be executed on a hybrid computing system comprising at least one digital or classical processor and a quantum processor, for example hybrid computing system 100 of FIG. 1, or may be executed on a quantum computing system comprising at least one quantum processor. Method 1300 is similar to method 1200, and is performed on a set of qubits.

Method 1300 comprises acts 1302 to 1318, however, a person skilled in the art will understand that the number of acts illustrate is an example, and, in some implementations, certain acts may be omitted, further acts may be added, and/or the order of the acts may be changed. Method 1300 may, for example, be used to operate superconducting integrated circuit 1000 discussed above as a synchronized control quench source for quenching a plurality of qubits and reading out their states.

Method 1300 starts, for example, in response to a call or invocation from another routine.

At 1302, the current in a plurality of pulse source control lines is increased to a first threshold (e.g., first predetermined threshold), the plurality of pulse source control lines in communication with respective pulse sources, each pulse source having a respective pulse compound Josephson junction (CJJ). In some implementations the pulse sources may have first and second control lines, such as control lines 1004 and 1016 of FIG. 10, where the first pulse source control line 1016 is galvanically coupled to pulse CJJ 1002 and the second pulse source control line 1004 is inductively coupled to pulse CJJ 1002. The current in the plurality of first and second pulse source control lines may be increased to achieve a combined current at the first threshold (e.g., first predetermined threshold or first specified threshold). In some implementations this threshold may be around 100 uA. The first threshold (e.g., first predetermined threshold or first specified threshold) may be selected to be below the threshold that pushes the pulse CJJ 1002 into the voltage state, and may prepare or prime the pulse source for triggering by a trigger source.

At 1304, the current through a trigger control line for a trigger source is increased to a second threshold (e.g., second predetermined threshold or second specified threshold), the trigger source having a trigger CJJ. In some implementations, the trigger source may also have first and second control lines, such as control lines 1028 and 1030 of FIG. 10, where first trigger source control line 1028 is galvanically coupled to trigger source CJJ 1026 and second trigger source control line 1030 is inductively coupled to trigger source CJJ 1026. The current in the first and second trigger control lines may be increased to achieve a combined current at the second threshold (e.g., second predetermined threshold or second specified threshold). In some implementations this threshold may be around 100 uA.

At 1306, the current through a programming source control line for a programming source (in some implementations, a dc/SFQ converter) is increased to a third threshold (e.g., third predetermined threshold or third specified threshold), the programming source having a programming CJJ, the third threshold (e.g., third predetermined threshold or third specified threshold) selected such that the programming CJJ transitions and provides a flux quantum to a line inductively coupled to the trigger CJJ such that the trigger CJJ transitions or jumps to the voltage state, as discussed above. In some implementations, the programming source may also have first and second programming source control lines, such as control lines 1020 and 1022 of FIG. 10, with first programming source control line 1020 galvanically coupled to programming CJJ 1018 and second programming source control line 1022 inductively coupled to programming CJJ 1018. The current in the first and second programming source control lines may be increased to achieve a combined current at the third threshold (e.g., third predetermined threshold or third specified threshold). In some implementations this threshold may be around 100 uA. In other implementations, this threshold may be around 1 mA. In some implementations, the threshold is determined by the critical current of a CJJ, which may, for example, be determined by the materials used to form the junctions, as well as other fabrication parameters.

At 1308, a plurality of trigger transmission lines from the trigger CJJ are charged, each trigger transmission line galvanically coupled to the trigger CJJ and inductively coupled to a respective pulse CJJ. The voltage from the trigger CJJ (e.g., 1026 in FIG. 10) charges the transmission lines (e.g., 1034*a*, 1034*b* in FIG. 10) that are in communication with the pulse sources (e.g., inductively coupled as shown in FIG. 10). In some implementations, this voltage charge may beneficially occur on 5 Ohm transmission load lines, and may occur faster than the rise-time of each pulse source. Each pulse source may therefore be triggered at the same time by the rising trigger source load current.

At 1310, each pulse CJJ (e.g., 1002 in FIG. 10) is transitioned by the charged trigger transmission lines.

At 1312, a plurality of pulse source transmission lines (e.g., 1008 in FIG. 10) are charged from the pulse CJJs, the plurality of pulse source transmission lines galvanically coupled to a respective one of the pulse CJJs.

At 1314, a plurality of control pulses is delivered to a plurality of qubits (e.g., qubit 1036 of FIG. 10), each qubit in communication with a respective one of the plurality of pulse source transmission lines. The control pulses may be delivered concurrently or even substantially simultaneously. In some implementations, the dynamics of the one or more qubits are stopped by the control pulse. The dynamics of the qubits may be an evolution, such as an annealing evolution. In some implementations, the plurality of qubits may be programmed into a desired pre-quench state prior to the plurality of control pulses being delivered. For example, in some implementations the plurality of qubits may be annealed to a mid-anneal state of interest. The state of the plurality of qubits may be read out after the qubit dynamics are stopped in response to the control pulses. This may beneficially allow for the qubit dynamics across an entire processor to be stopped simultaneously and read out to provide information about the processor or qubit dynamics as a whole.

At 1316, the energy stored in the plurality of pulse source transmission lines is dissipated. In some implementations, the energy is dissipated through a plurality of resistors, each resistor of the plurality of resistors connected to a respective one of the transmission lines, such as resistor 1014 of FIG. 10. The programming source may also be reset by dissipating energy through a resistor. For example, in some implementations these may be 8 mOhm resistors. These may be dimensioned so that the trigger mechanism fires exactly once. The current in the control line used to trigger the programming source may beneficially be reduced fast enough to ensure that the process does not repeat or re-trigger.

At 1318, the state of the qubits are read out, such as by readout system 128 of FIG. 1. Reading out the state of a set of qubits can, in some example implementations, include detecting the state of the qubits, such as by coupling to a QFP shift register, and transmitting the qubit states to a digital processor for presentation to a user, inclusion in another method, or other purposes as are known in the art. In some implementations method 1300 can be repeated as part of a quantum annealing process that provides multiple samples of qubit states.

Method 1300 may then terminate until it is, for example, invoked again, or method 130 may repeat.

The above described method(s), process(es), or technique(s) could be implemented by a series of processor readable instructions stored on one or more nontransitory processor-readable media. Some examples of the above described method(s), process(es), or technique(s) method are performed in part by a specialized device such as an adiabatic quantum computer or a quantum annealer or a system to program or otherwise control operation of an adiabatic quantum computer or a quantum annealer, for instance a computer that includes at least one digital processor. The above described method(s), process(es), or technique(s) may include various acts, though those of skill in the art will appreciate that in alternative examples certain acts may be omitted and/or additional acts may be added. Those of skill in the art will appreciate that the illustrated order of the acts is shown for example purposes only and may change in alternative examples. Some of the example acts or operations of the above described method(s), process(es), or technique(s) are performed iteratively. Some acts of the above described method(s), process(es), or technique(s) can be performed during each iteration, after a plurality of iterations, or at the end of all the iterations.

The above description of illustrated implementations, including what is described in the Abstract, is not intended to be exhaustive or to limit the implementations to the precise forms disclosed. Although specific implementations of and examples are described herein for illustrative purposes, various equivalent modifications can be made without departing from the spirit and scope of the disclosure, as will be recognized by those skilled in the relevant art. The teachings provided herein of the various implementations can be applied to other methods of quantum computation, not necessarily the example methods for quantum computation generally described above.

The various implementations described above can be combined to provide further implementations. All of the commonly assigned US patent application publications, US patent applications, foreign patents, and foreign patent applications referred to in this specification and/or listed in the Application Data Sheet are incorporated herein by reference, in their entirety, including but not limited to:

U.S. Pat. Nos. 8,169,231; 8,536,566; 8,854,074; 8,951,808; US Patent Application Publication No. 2021/0013391; U.S. Provisional Patent Application Nos. 63/023,048; 63/136,987; 63/223,686; International Application No. PCT/US2022/037457; and International Publication Nos. WO 2019/217313; WO 2019/222514; WO 2020/168097; WO 2022/155140; WO2021/231224.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A superconducting integrated circuit comprising:
a first compound Josephson junction (CJJ);
a first control line in communication with the first CJJ; and
a first superconducting current path interrupted by the first CJJ, the first superconducting current path comprising:
a transmission line in communication with a target device;
a filter in series with the transmission line; and
a resistor in series with the transmission line.

2. The superconducting integrated circuit of claim 1, wherein the first control line in communication with the first CJJ comprises a first power control line galvanically coupled to the first CJJ and a first trigger control line inductively coupled to the first CJJ.

3. The superconducting integrated circuit of claim 1, wherein the transmission line is communicatively coupled to a qubit.

4. The superconducting integrated circuit of claim 3, wherein the qubit comprises a qubit CJJ, and the transmission line is magnetically coupled to the qubit CJJ.

5. The superconducting integrated circuit of claim 1, further comprising:
a second CJJ;
a second control line in communication with the second CJJ;
a superconducting loop interrupted by the second CJJ;
a third CJJ inductively coupled to the superconducting loop;
a third control line in communication with the third CJJ; and
a second superconducting current path interrupted by the third CJJ, the second superconducting current path comprising one or more additional transmission lines, at least one of the one or more additional transmission lines communicatively coupled to the first CJJ.

6. The superconducting integrated circuit of claim 5, wherein the second control line in communication with the second CJJ comprises a second power control line galvanically coupled to the second CJJ and a second trigger control line inductively coupled to the second CJJ.

7. The superconducting integrated circuit of claim 5, wherein the third control line in communication with the third CJJ comprises a third power control line galvanically coupled to the third CJJ and a third trigger control line inductively coupled to the third CJJ.

8. The superconducting integrated circuit of claim 5, wherein the second superconducting current path comprises two or more additional transmission lines, a first one of the two or more additional transmission lines communicatively coupled to the first CJJ and a second one of the two or more additional transmission lines communicatively coupled to a fourth CJJ of a device, the device comprising:
a fourth control line in communication with the fourth CJJ and a fourth superconducting current path interrupted by the fourth CJJ, the fourth superconducting current path comprising:
a fourth transmission line in communication with a second target device;
a fourth filter in series with the fourth transmission line; and
a fourth resistor in series with the fourth transmission line.

9. A method of delivering a control pulse through a pulse source, the method comprising:
increasing a current in a control line to a threshold such that a compound Josephson junction (CJJ) transitions to a voltage state;
charging a transmission line from the CJJ;
delivering a control pulse to a device in communication with the transmission line; and
dissipating energy stored in the transmission line through a resistor to reset the pulse source.

10. The method of claim 9, wherein increasing the current in a control line to a threshold comprises increasing the current in two control lines to achieve a combined current at the threshold.

11. The method of claim 9, wherein delivering a control pulse to a device in communication with the transmission line comprises delivering a control pulse to one or more qubits in communication with the transmission line, an evolution of the one or more qubits being stopped by the control pulse.

12. The method of claim 9, wherein delivering a control pulse to a device in communication with the transmission line comprises delivering a control pulse to a coupler to produce a coupling gate.

13. A method of operating a synchronized control quench source, the method comprising:
increasing a current in a plurality of pulse source control lines to a first threshold, the plurality of pulse source control lines in communication with respective pulse sources, each pulse source having a respective pulse compound Josephson junction (CJJ);
increasing the current through a trigger control line for a trigger source to a second threshold, the trigger source having a trigger CJJ;
increasing the current through a programming source control line for a programming source to a third threshold, the programming source having a programming CJJ, the third threshold selected such that the programming CJJ transitions and provides a flux quantum to a line inductively coupled to the trigger CJJ such that the trigger CJJ transitions;
charging a plurality of trigger transmission lines from the trigger CJJ, each trigger transmission line galvanically coupled to the trigger CJJ and inductively coupled to a respective pulse CJJ;
transitioning each pulse CJJ by the plurality of charged trigger transmission lines;
charging a plurality of pulse source transmission lines from the pulse CJJs, the plurality of pulse source transmission lines galvanically coupled to a respective one of the pulse CJJs;
delivering a plurality of control pulses to a plurality of devices, each device of the plurality of devices in communication with a respective one of the plurality of pulse source transmission lines; and
dissipating energy stored in the plurality of pulse source transmission lines.

14. The method of claim 13, wherein dissipating the energy stored in the plurality of pulse source transmission lines comprises dissipating the energy through a plurality of resistors, each resistor of the plurality of resistors connected to a respective one of the plurality of pulse source transmission lines.

15. The method of claim 13, wherein delivering a plurality of control pulses to a plurality of devices comprises delivering a plurality of control pulses to a plurality of qubits, an evolution of the plurality of qubits being stopped by the control pulse.

16. The method of claim 15, further comprising programming the plurality of qubits into a desired pre-quench state prior to delivering the plurality of control pulses.

17. The method of claim 13, wherein delivering a plurality of control pulses to a plurality of devices comprises delivering a plurality of control pulses to a plurality of couplers to produce a plurality of coupling gates.

18. The method of claim 13, wherein increasing the current in the plurality of pulse source control lines comprises increasing the current in a plurality of first and second pulse source control lines to achieve a combined current at the first threshold, each first pulse source control line being galvanically coupled to the respective pulse CJJ and each second pulse source control line being inductively coupled to the respective pulse CJJ.

19. The method of claim 13, wherein increasing the current through a trigger control line comprises increasing the current in first and second trigger source control lines to achieve a combined current at the second threshold, the first trigger source control line being galvanically coupled to the trigger source CJJ and the second trigger source control line being inductively coupled to the trigger source CJJ.

20. The method of claim 13, wherein increasing the current through a programming source control line comprises increasing the current in first and second programming source control lines to achieve a combined current at the third threshold, the first programming source control line being galvanically coupled to the programming CJJ and the second programming source control line being inductively coupled to the programming CJJ.

* * * * *